(12) United States Patent
Ishizu et al.

(10) Patent No.: US 11,309,431 B2
(45) Date of Patent: Apr. 19, 2022

(54) MEMORY DEVICE, SEMICONDUCTOR DEVICE, AND ELECTRONIC DEVICE

(71) Applicant: Semiconductor Energy Laboratory Co., Ltd., Atsugi (JP)

(72) Inventors: Takahiko Ishizu, Sagamihara (JP); Kazuma Furutani, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/053,467

(22) PCT Filed: May 7, 2019

(86) PCT No.: PCT/IB2019/053709
§ 371 (c)(1),
(2) Date: Nov. 6, 2020

(87) PCT Pub. No.: WO2019/220259
PCT Pub. Date: Nov. 21, 2019

(65) Prior Publication Data
US 2021/0265504 A1    Aug. 26, 2021

(30) Foreign Application Priority Data

May 17, 2018 (JP) .............................. JP2018-095468
Jun. 6, 2018 (JP) .............................. JP2018-108278

(51) Int. Cl.
*H01L 29/78* (2006.01)
*G11C 11/40* (2006.01)
(Continued)

(52) U.S. Cl.
CPC .......... *H01L 29/7869* (2013.01); *G11C 5/063* (2013.01); *G11C 11/405* (2013.01);
(Continued)

(58) Field of Classification Search
None
See application file for complete search history.

(56) References Cited

U.S. PATENT DOCUMENTS 5,909,400 A * 6/1999 Bertin .................. G11C 11/405
365/187
5,943,270 A * 8/1999 Borkar ................. G11C 11/403
365/189.14
(Continued)

FOREIGN PATENT DOCUMENTS

CN       107785050 A    3/2018
JP       2007-328871 A  12/2007
(Continued)

OTHER PUBLICATIONS

International Search Report (Application No. PCT/IB2019/053709) dated Jul. 30, 2019.
(Continued)

*Primary Examiner* — Tan T. Nguyen
(74) *Attorney, Agent, or Firm* — Robinson Intellectual Property Law Office; Eric J. Robinson

(57) ABSTRACT

A memory device which includes a gain-cell memory cell formed using an n-channel transistor and in which a potential lower than a potential applied to a bit line is not necessary is provided. Memory cells included in the memory device are arranged in a matrix, and each of the memory cells is connected to a write word line, a write bit line, a read word line, and a read bit line. The write word line is arranged in parallel to one of directions of a row and a column of memory cells arranged in a matrix, and the write bit line is arranged in parallel to the other of the directions of the row and the column. The read word line is arranged in parallel to the one of the directions of the row and the column of the memory cells arranged in a matrix, and the (Continued)

read bit line is arranged in parallel to the other of the directions of the row and the column.

8 Claims, 22 Drawing Sheets

(51) Int. Cl.
*H01L 29/786* (2006.01)
*G11C 5/06* (2006.01)
*G11C 11/405* (2006.01)
*G11C 11/4093* (2006.01)
*G11C 11/4096* (2006.01)
*H01L 27/108* (2006.01)

(52) U.S. Cl.
CPC ...... *G11C 11/4093* (2013.01); *G11C 11/4096* (2013.01); *H01L 27/10897* (2013.01); *H01L 29/78696* (2013.01)

(56) References Cited

U.S. PATENT DOCUMENTS

| | | | |
|---|---|---|---|
| 8,508,967 | B2 | 8/2013 | Yamazaki et al. |
| 8,514,609 | B2* | 8/2013 | Kawae .................. G11C 11/405 365/149 |
| 8,588,000 | B2 | 11/2013 | Kamata |
| 8,614,916 | B2 | 12/2013 | Nagatsuka et al. |
| 9,728,243 | B2 | 8/2017 | Kato |
| 9,734,914 | B2 | 8/2017 | Kamata |
| 9,761,598 | B2 | 9/2017 | Kurokawa |
| 10,037,808 | B2 | 7/2018 | Kamata |
| 10,141,036 | B2 | 11/2018 | Yamauchi |
| 2011/0286256 | A1 | 11/2011 | Kamata |
| 2012/0294070 | A1* | 11/2012 | Matsuzaki .......... H01L 27/1156 365/149 |
| 2014/0071768 | A1 | 3/2014 | Kamata |
| 2014/0307501 | A1* | 10/2014 | Louie .................... G11C 11/417 365/154 |
| 2014/0374747 | A1 | 12/2014 | Kurokawa |
| 2015/0036417 | A1* | 2/2015 | Jung .................... G11C 11/412 365/154 |
| 2016/0336055 | A1 | 11/2016 | Kato |
| 2017/0358363 | A1 | 12/2017 | Kamata |
| 2018/0061464 | A1 | 3/2018 | Yamauchi |

FOREIGN PATENT DOCUMENTS

| | | |
|---|---|---|
| JP | 2012-004556 A | 1/2012 |
| JP | 2012-256400 A | 12/2012 |
| JP | 2012-256820 A | 12/2012 |
| JP | 2015-029260 A | 2/2015 |
| JP | 2015-130512 A | 7/2015 |
| JP | 2016-076717 A | 5/2016 |
| JP | 2016-086421 A | 5/2016 |
| JP | 2016-212944 A | 12/2016 |
| JP | 2017-016730 A | 1/2017 |
| JP | 6164713 | 7/2017 |
| JP | 2018-032455 A | 3/2018 |
| KR | 2014-0148311 A | 12/2014 |
| KR | 2018-0022566 A | 3/2018 |
| WO | WO-2011/145738 | 11/2011 |

OTHER PUBLICATIONS

Written Opinion (Application No. PCT/IB2019/053709) dated Jul. 30, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

\* cited by examiner

MEMORY DEVICE, SEMICONDUCTOR DEVICE, AND ELECTRONIC DEVICE

TECHNICAL FIELD

One embodiment of the present invention relates to a memory device. In particular, one embodiment of the present invention relates to a memory device that can function by utilizing semiconductor characteristics.

One embodiment of the present invention relates to a semiconductor device. Note that in this specification and the like, a semiconductor device refers to all devices that can function by utilizing semiconductor characteristics. For example, an integrated circuit, a chip including an integrated circuit, an electronic component including a packaged chip, and an electronic device including an integrated circuit are examples of a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

In recent years, as a semiconductor that can be used in a transistor, an oxide semiconductor has been attracting attention. A transistor using an oxide semiconductor (also referred to as an oxide semiconductor transistor or an OS transistor) is a thin film transistor and can be stacked. For example, a first circuit can be formed using a Si transistor formed on a single crystal silicon substrate, and a second circuit using an OS transistor can be stacked thereabove. Moreover, an OS transistor has a characteristic of extremely low leakage current in an off state (also referred to as off-state current).

Patent Document 1 discloses a semiconductor device including a plurality of memory cells each using an OS transistor over a semiconductor substrate where peripheral circuits such as a driver circuit and a control circuit are formed, and an example in which an OS transistor is used in a memory cell of a DRAM (Dynamic Random Access Memory). For example, when a peripheral circuit is formed using a Si transistor formed on a single crystal silicon substrate and a memory cell using an OS transistor is stacked thereabove, a chip area can be reduced.

Patent Document 2 discloses a semiconductor device including a plurality of memory cells using an OS transistor and a transistor other than an OS transistor (e.g., a Si transistor), and an example in which an OS transistor is used in a gain-cell memory cell with two transistors and one capacitor (the capacitor may be omitted). A gain-cell memory cell can operate as a memory by amplifying accumulated charges by the closest transistor even when the capacitance of the capacitor is small. When an OS transistor having a characteristic of extremely low off-state current is used in the gain-cell memory cell, accumulated charges can be retained for a long time.

Note that in this specification and the like, a semiconductor device formed using a gain-cell memory cell using an OS transistor is called a "NOSRAM (registered trademark, Nonvolatile Oxide Semiconductor Random Access Memory)". Hereinafter, a semiconductor device including a memory cell, a NOSRAM, and a semiconductor device including a peripheral circuit and a plurality of memory cells are referred to as a memory device or a memory.

Meanwhile, not only single-component metal oxides, such as indium oxide and zinc oxide, but also multi-component metal oxides are known as oxide semiconductors, for example. Among the multi-component metal oxides, in particular, an In—Ga—Zn oxide (also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3).

Non-Patent Document 1 and Non-Patent Document 2 disclose a technique for fabricating a transistor using an oxide semiconductor having a CAAC structure. Moreover, Non-Patent Document 4 and Non-Patent Document 5 disclose that a fine crystal is included even in an oxide semiconductor that has lower crystallinity than an oxide semiconductor having the CAAC structure or the nc structure.

Non-Patent Document 6 reports the extremely low off-state current of a transistor using an oxide semiconductor, and Non-Patent Document 7 and Non-Patent Document 8 report an LSI and a display which utilize such a property of extremely low off-state current.

REFERENCE

Patent Document

[Patent Document 1] Japanese Published Patent Application No. 2012-256820
[Patent Document 2] Japanese Published Patent Application No. 2012-256400

Non-Patent Document

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

As disclosed in Patent Document 2, in the case where a memory cell is formed using an OS transistor and a transistor other than an OS transistor, for example, in the case where a memory cell is formed using a Si transistor formed over a single crystal silicon substrate and an OS transistor stacked thereabove, unlike in Patent Document 1, a peripheral circuit cannot be formed on the single crystal silicon substrate positioned below the memory cell. More accurately, in order to form the peripheral circuit on the single crystal silicon substrate positioned below the memory cell, a region for forming the peripheral circuit needs to be provided between the memory cells.

Alternatively, as in Patent Document 1, transistors forming the memory cells needs to be only OS transistors in order to stack, over the semiconductor substrate where the peripheral circuit is formed, the memory cells using OS transistors. The OS transistor is an n-channel transistor; thus, when gain-cell memory cells disclosed in Patent Document 2 are formed using only n-channel transistors, a potential lower than a potential applied to a bit line needs to be applied to a word line. For example, in the case where the lowest potential among potentials applied to the bit line is GND, a potential lower than GND, i.e., a negative potential needs to be applied to the word line.

An object of one embodiment of the present invention is to provide a memory device including a gain-cell memory cell, where the memory cell using an OS transistor is stacked over a semiconductor substrate where a peripheral circuit is formed and where a negative potential does not need to be applied. Another object of one embodiment of the present invention is to provide a memory device which includes a gain-cell memory cell and has a small chip area and where a negative potential does not need to be applied. Another object of one embodiment of the present invention is to provide an electronic device including a memory device which includes a gain-cell memory cell and has a small chip area and where a negative potential does not need to be applied.

Note that one embodiment of the present invention does not necessarily achieve all the above objects and only needs to achieve at least one of the objects. The descriptions of the above objects do not preclude the existence of other objects. Objects other than these will be apparent from the description of the specification, the claims, the drawings, and the like, and objects other than these can be derived from the description of the specification, the claims, the drawings, and the like.

Means for Solving the Problems

One embodiment of the present invention is a memory device including a memory cell array and a peripheral circuit. The memory cell array includes m×n (each of m and n is an integer greater than or equal to 1) memory cells, n first wirings, n second wirings, m third wirings, and m fourth wirings. The m×n memory cells are arranged in a matrix, and each of the memory cells is electrically connected to the first to fourth wirings and includes a first transistor and a second transistor. One of a source and a drain of the first transistor is electrically connected to the first wiring, the other of the source and the drain of the first transistor is electrically connected to a gate of the second transistor, and a gate of the first transistor is electrically connected to the third wiring. One of a source and a drain of the second transistor is electrically connected to the second wiring, and the other of the source and the drain of the second transistor is electrically connected to the fourth wiring. Each of the first transistor and the second transistor is an n-channel transistor and includes a metal oxide in a channel formation region. The peripheral circuit includes a first circuit, a second circuit, and a controller, and the first circuit is electrically connected to the first wiring and the second wiring and has a function of writing data to the memory cell and a function of reading data from the memory cell. The second circuit is electrically connected to the third wiring and the fourth wiring and has a function of driving the third wiring and the fourth wiring, and the controller has a function of controlling the first circuit and the second circuit.

Another embodiment of the present invention is a memory device including a memory cell array and a peripheral circuit. The memory cell array includes m×n (each of m and n is an integer greater than or equal to 1) memory cells, n first wirings, n second wirings, m third wirings, and m fourth wirings. The m×n memory cells are arranged in a matrix, and each of the memory cells is electrically connected to the first to fourth wirings and includes a first transistor and a second transistor. One of a source and a drain of the first transistor is electrically connected to the first wiring, the other of the source and the drain is electrically connected to a gate of the second transistor, and a gate of the first transistor is electrically connected to the third wiring. One of a source and a drain of the second transistor is electrically connected to the second wiring, and the other of the source and the drain is electrically connected to the fourth wiring. Each of the first transistor and the second transistor is an n-channel transistor and includes a metal oxide in a channel formation region. The peripheral circuit includes a first circuit, a second circuit, and a controller, and the first circuit is electrically connected to the first wiring and the second wiring and has a function of writing data to the memory cell and a function of reading data from the memory cell. The second circuit is electrically connected to the third wiring and the fourth wiring and has a function of driving the third wiring and the fourth wiring, and the controller has a function of controlling the first circuit and the second circuit and has a function of a serial peripheral interface.

Another embodiment of the present invention is a memory device including a memory cell array and a peripheral circuit. The memory cell array includes m×n (each of m and n is an integer greater than or equal to 1) memory cells, n first wirings, n second wirings, m third wirings, and m fourth wirings. The m×n memory cells are arranged in a matrix, and each of the memory cells is electrically connected to the first to fourth wirings and includes a first transistor and a second transistor. One of a source and a drain of the first transistor is electrically connected to the first wiring, the other of the source and the drain is electrically connected to a gate of the second transistor, and a gate of the first transistor is electrically connected to the third wiring. One of a source and a drain of the second transistor is electrically connected to the second wiring, and the other of the source and the drain is electrically connected to the fourth wiring. Each of the first transistor and the second transistor is an n-channel transistor and includes a metal oxide in a channel formation region. The peripheral circuit includes a first circuit, a second circuit, a controller, and a page buffer, the first circuit is electrically connected to the first wiring and the second wiring, the page buffer has a function of temporarily storing data, and the controller has a function of writing data to the page buffer and a function of reading data from the page buffer. The first circuit has a function of writing data read from the page buffer, to the memory cell and a function of writing data read from the memory cell, to the page buffer. The second circuit is electrically connected to the third wiring and the fourth wiring and has a function of driving the third wiring and the fourth wiring, and the controller has a function of controlling the first circuit and the second circuit and a function of a serial peripheral interface.

In the above embodiment, each of the memory cells includes a capacitor, one electrode of the capacitor is electrically connected to the gate of the second transistor, and the other electrode of the capacitor is electrically connected to a wiring supplied with a predetermined potential.

In the above embodiment, the first circuit supplies a first potential or a second potential to the first wiring and the second wiring. The second circuit supplies the first potential or the second potential to the fourth wiring and supplies the first potential or a third potential to the third wiring.

In the above embodiment, each of the first circuit and the second circuit includes a transistor formed on a semiconductor substrate, and the first transistor and the second transistor are stacked above the semiconductor substrate.

Effect of the Invention

According to one embodiment of the present invention, a memory device including a gain-cell memory cell, where the memory cell using an OS transistor is stacked above a semiconductor substrate where a peripheral circuit is formed and where a negative potential does not need to be applied can be provided. According to one embodiment of the present invention, a memory device which includes a gain-cell memory cell and has a small chip area and where a negative potential does not need to be applied can be provided. According to one embodiment of the present invention, an electronic device including a memory device which includes a gain-cell memory cell and has a small chip area and where a negative potential does not need to be applied can be provided.

Note that the descriptions of the effects do not disturb the existence of other effects. One embodiment of the present invention does not necessarily have all the effects. Effects other than these will be apparent from the descriptions of the specification, the claims, the drawings, and the like, and effects other than these can be derived from the descriptions of the specification, the claims, the drawings, and the like.

BRIEF DESCRIPTION OF THE DRAWINGS

FIGS. 19(A), 19(B), 19(C), 19(D), 19(E1), and 19(E2) are diagrams illustrating structure examples of electronic devices.

MODE FOR CARRYING OUT THE INVENTION

Figure 1:
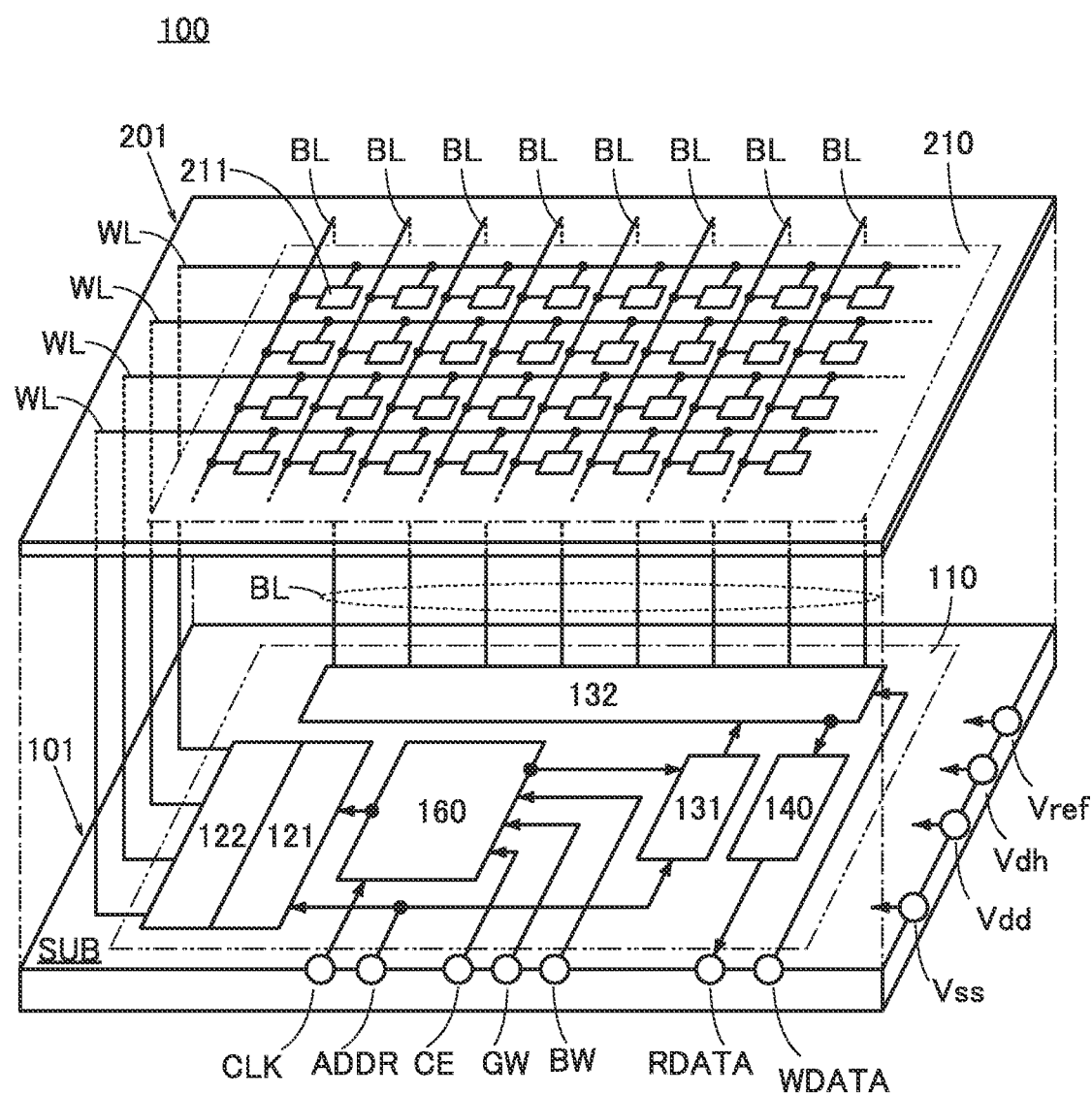
FIG. 1 is a schematic perspective view illustrating a structure example of a memory device.

Embodiments will be described below with reference to the drawings. However, the embodiments can be implemented with many different modes, and it will be readily appreciated by those skilled in the art that modes and details thereof can be changed in various ways without departing from the spirit and scope thereof. Thus, the present invention should not be interpreted as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to separate actual components completely according to their functions, and it is possible for one component to relate to a plurality of functions.

In the drawings and the like, the size, the layer thickness, the region, or the like is exaggerated for clarity in some cases. Thus, they are not necessarily limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

Moreover, in this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, "voltage" often refers to a potential difference between a given potential and a reference potential (e.g., a ground potential). Thus, a voltage and a potential difference can be interchanged with each other.

In this specification and the like, a transistor is an element having at least three terminals including a gate, a drain, and a source. A channel formation region is included between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Thus, the terms of source and drain are interchangeable for use in this specification and the like.

Unless otherwise specified, an off-state current in this specification and the like refers to a drain current of a transistor in an off state (also referred to as a non-conducting state or a cutoff state). Unless otherwise specified, the off state of an n-channel transistor refers to a state where voltage Vgs of a gate with respect to a source is lower than a threshold voltage Vth, and the off state of a p-channel transistor refers to a state where the voltage Vgs of a gate with respect to a source is higher than the threshold voltage Vth. That is, the off-state current of an n-channel transistor sometimes refers to a drain current at the time when the voltage Vgs of a gate with respect to a source is lower than the threshold voltage Vth.

In the above description of the off-state current, the drain may be replaced with the source. That is, the off-state current sometimes refers to a source current when the transistor is in an off state. In addition, leakage current sometimes expresses the same meaning as off-state current. In this specification and the like, the off-state current sometimes refers to a current that flows between a source and a drain when a transistor is in the off state.

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is called an oxide semiconductor in some cases. That is, in the case where a metal oxide has at least one of an amplifying function, a rectifying function, and a switching function, the metal oxide can be called a metal oxide semiconductor. In other words, a transistor containing a metal oxide in a channel formation region can be referred to as an "oxide semiconductor transistor" or an "OS transistor". Similarly, the "transistor using an oxide semiconductor" described above is also a transistor containing a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, structure examples of a memory device according to one embodiment of the present invention will be described. The memory device according to one embodiment of the present invention is a memory device that can function by utilizing semiconductor characteristics, and is also called a memory. In addition, the memory device according to one embodiment of the present invention has a structure in which a memory cell formed using an OS transistor is stacked over a semiconductor substrate where a peripheral circuit is formed.

<Schematic Perspective View of Memory Device>

FIG. 1 is a schematic perspective view illustrating a structure example of a memory device 100 according to one embodiment of the present invention.

The memory device 100 includes a layer 101 and a layer 201 and has a structure in which the layer 201 is stacked above the layer 101. In each of the layer 101 and the layer 201, a circuit that can function by utilizing semiconductor characteristics is provided; a peripheral circuit 110 is provided in the layer 101, and a memory cell array (Memory Cell Array) 210 is provided in the layer 201. Note that in the drawings described in this specification and the like, the flow of main signals is indicated by an arrow or a line, and a power supply line and the like are omitted in some cases.

The peripheral circuit 110 includes a row decoder 121, a word line driver circuit 122, a column decoder 131, a bit line driver circuit 132, an output circuit 140, and a control logic circuit 160. Note that the peripheral circuit 110 has a function of a driver circuit and a control circuit for the memory cell array 210.

The peripheral circuit 110 is formed with transistors formed on a semiconductor substrate SUB. There is no particular limitation on the semiconductor substrate SUB as long as a channel region of a transistor can be formed thereover. For example, a single crystal silicon substrate, a single crystal germanium substrate, a compound semiconductor substrate (such as a SiC substrate or a GaN substrate), an SOI (Silicon on Insulator) substrate, or the like can be used.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing, or an SOI substrate formed by using a Smart-Cut method in which a semiconductor substrate is cleaved by utilizing growth of a minute void, which is formed by implantation of a hydrogen ion, by thermal treatment; an ELTRAN method (a registered trademark: Epitaxial Layer Transfer). A transistor formed using a single crystal substrate contains a single crystal semiconductor in a channel formation region.

In this embodiment, a case in which a single crystal silicon substrate is used as the semiconductor substrate SUB will be described. A transistor formed on a single crystal silicon substrate is referred to as a Si transistor. The peripheral circuit 110 formed using Si transistors can operate at high speed.

The memory cell array 210 includes a plurality of memory cells 211, and the memory cell 211 is formed using an OS transistor. The OS transistor is a thin film transistor, and thus, the memory cell array 210 can be stacked over the semiconductor substrate SUB.

Here, an oxide semiconductor has a bandgap of 2.5 eV or larger, preferably 3.0 eV or larger; thus, an OS transistor has a low leakage current due to thermal excitation and also has extremely low off-state current. Note that off-state current refers to current that flows between a source and a drain when a transistor is off.

A metal oxide used in a channel formation region of the OS transistor is preferably an oxide semiconductor containing at least one of indium (In) and zinc (Zn). Typical examples of such an oxide semiconductor include an In—M—Zn oxide (an element M is Al, Ga, Y, or Sn, for example). Reducing both impurities serving as electron donors, such as moisture or hydrogen, and oxygen vacancies can make an oxide semiconductor i-type (intrinsic) or substantially i-type. Such an oxide semiconductor can be referred to as a highly purified oxide semiconductor. Note that the details of an OS transistor will be described in Embodiment 4.

The memory cell 211 has a function of storing data by accumulating and retaining charge. The memory cell 211 may have a function of storing binary (high level or low level) data or may have a function of storing data of four or more levels. The memory cell 211 may have a function of storing analog data.

An OS transistor has an extremely low off-state current and thus is suitably used as a transistor included in the memory cell 211. An off-state current per micrometer of channel width of an OS transistor can be, for example, lower than or equal to 100 zA/μm, lower than or equal to 10 zA/μm, lower than or equal to 1 zA/μm, or lower than or equal to 10 yA/μm. The use of an OS transistor in the memory cell 211 enables data stored in the memory cell 211 to be retained for a long time.

Since off-state current of the OS transistor is not easily increased even at high temperatures, data stored in the memory cell 211 is less likely to be lost even at high temperatures caused by heat generation by the peripheral circuit 110. The use of an OS transistor can increase the reliability of the memory device 100.

Figure 2:
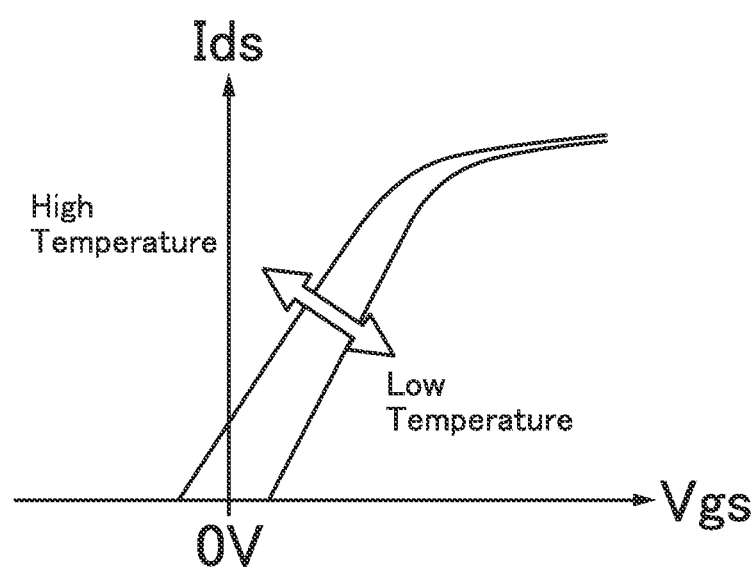
FIG. 2 is a schematic view showing a relation between $V_{gs}$ and $I_{ds}$ of a transistor.

FIG. 2 shows a relation between Vgs and Ids of the OS transistor. FIG. 2 is a schematic view showing a relation between a voltage of a gate with respect to a source, Vgs, and current that flows between the source and a drain, Ids, in the OS transistor when a constant voltage is applied between the source and the drain.

As shown in FIG. 2, the OS transistor has properties in that the threshold voltage negatively shifts as temperature becomes higher and that current flowing between the source and the drain when the transistor is on (also referred to as on-state current) is increased. In other words, the memory cell 211 can operate at high speed under high temperatures.

As illustrated in FIG. 1, in the memory cell array 210, the memory cells 211 are arranged in a matrix, and each of the memory cells 211 is connected to a wiring WL and a wiring BL. The memory cell 211 is selected by a potential applied to the wiring WL, and data is written to the selected memory cell 211 through the wiring BL. Alternatively, the memory cell 211 is selected by a potential applied to the wiring WL, and data is read from the selected memory cell 211 through the wiring BL.

In other words, the wiring WL has a function of a word line of the memory cell 211, and the wiring BL has a function of a bit line of the memory cell 211. Although not illustrated in FIG. 1, the wiring WL includes a word line wwl and a word line rwl, and the wiring BL includes a bit line wbl and a bit line rbl (see FIG. 3).

<Block Diagram of Memory Device>

Figure 3:
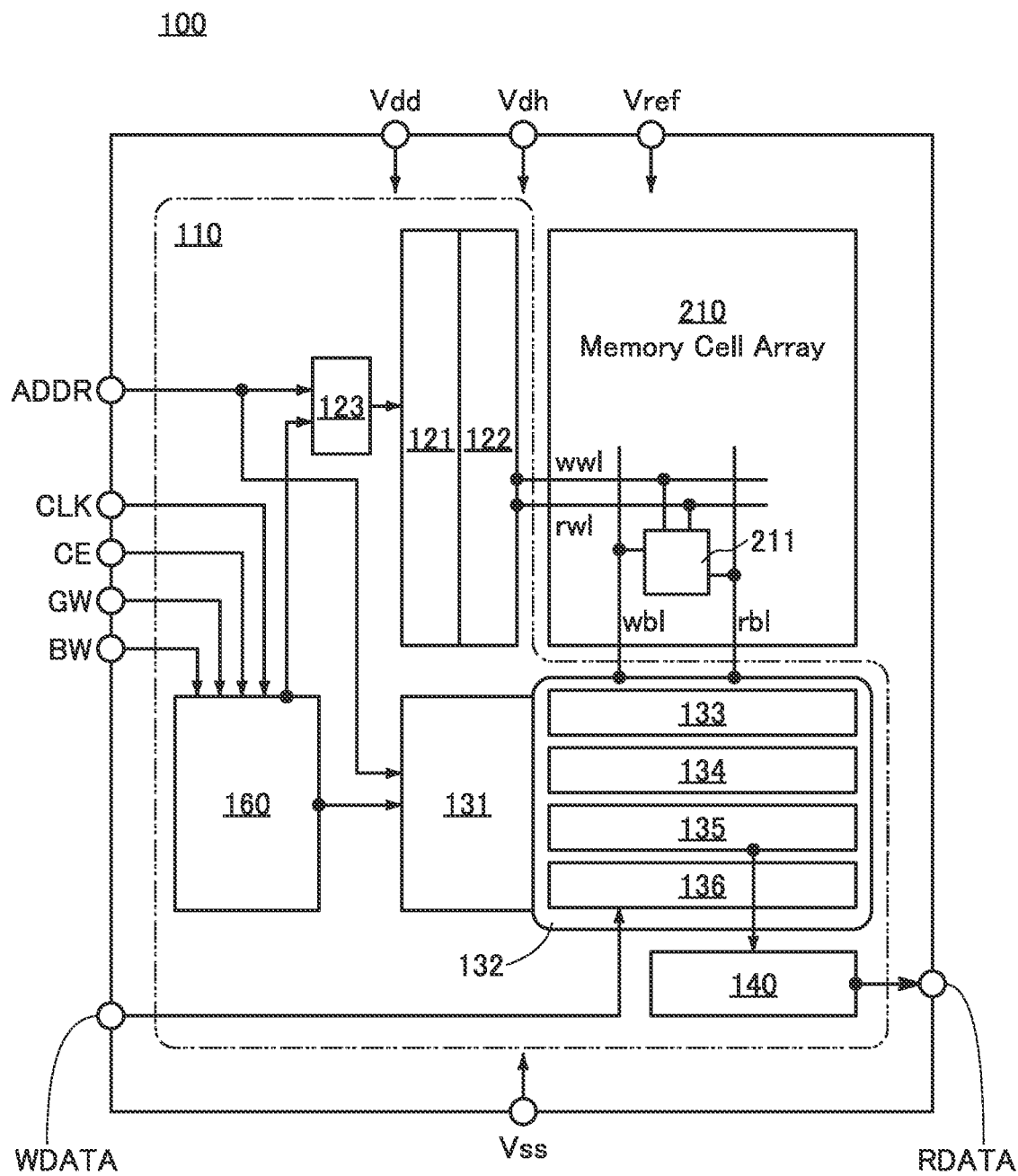
FIG. 3 is a block diagram illustrating a structure example of a memory device.

FIG. 3 is a block diagram illustrating a structure example of the memory device 100.

The memory device 100 includes the peripheral circuit 110 and the memory cell array 210. The peripheral circuit 110 includes the row decoder 121, the word line driver circuit 122, the column decoder 131, the bit line driver circuit 132, the output circuit 140, and the control logic circuit 160. The memory cell array 210 includes the memory cell 211, the word line wwl, the word line rwl, the bit line wbl, and the bit line rbl.

A potential Vss, a potential Vdd, a potential Vdh, and a reference potential Vref are input to the memory device 100. The potential Vdh is a high power supply potential of the word line wwl.

A clock signal CLK, a chip enable signal CE, a global write enable signal GW, a byte write enable signal BW, an address signal ADDR, and a data signal WDATA are input to the memory device 100, and the memory device 100 outputs a data signal RDATA. Note that these signals are digital signals represented by a high level or a low level (represented by High or Low, H or L, 1 or 0, or the like in some cases).

Here, each of the byte write enable signal BW, the address signal ADDR, the data signal WDATA, and the data signal RDATA is a signal having a plurality of bits.

In this specification and the like, as for a signal having a plurality of bits, for example, in the case where the byte write enable signal BW has four bits, the signal is represented by the byte write enable signal BW[3:0]. This means that the byte write enable signal includes BW[0] to BW[3]. In the case where one bit needs to be specified, for example, the signal is represented by the byte write enable signal BW[0]. When the signal is represented by the byte write enable signal BW, it means having a given bit.

For example, the byte write enable signal BW can have four bits, and each of the data signal WDATA and the data signal RDATA can have 32 bits. In other words, the byte write enable signal BW, the data signal WDATA, and the data signal RDATA are represented by the byte write enable signal BW[3:0], a data signal WDATA[31:0], and a data signal RDATA[31:0], respectively.

Note that in the memory device 100, each of the above circuits, signals, and potentials can be appropriately selected as needed. Alternatively, another circuit, another signal, or another potential may be added.

The control logic circuit 160 processes the chip enable signal CE and the global write enable signal GW and generates control signals for the row decoder 121 and the column decoder 131. For example, in the case where the chip enable signal CE is at a high level and the global write enable signal GW is at a low level, the row decoder 121 and the column decoder 131 perform reading operation; in the case where the chip enable signal CE is at a high level and the global write enable signal GW is at a high level, the row decoder 121 and the column decoder 131 perform writing operation; and in the case where the chip enable signal CE is at a low level, the row decoder 121 and the column decoder 131 can perform standby operation regardless of whether the global write enable signal GW is at a high level or a low level. Signals processed by the control logic circuit 160 are not limited to them, and other signals may be input as necessary.

Furthermore, the control logic circuit 160 processes the byte write enable signal BW[3:0] to control writing operation. Specifically, in the case where the byte write enable signal BW[0] is at a high level, the row decoder 121 and the column decoder 131 perform writing operation of the data signal WDATA[7:0]. Similarly, in the case where the byte write enable signal BW[1] is at a high level, writing operation of the data signal WDATA[15:8] is performed; in the case where the byte write enable signal BW[2] is at a high level, writing operation of the data signal WDATA[23:16] is performed; and in the case where the byte write enable signal BW[3] is at a high level, writing operation of the data signal WDATA[31:24] is performed.

An address signal ADDR is input to the row decoder 121 and the column decoder 131 in addition to the above control signals generated by the control logic circuit 160.

The row decoder 121 decodes the address signal ADDR and generates control signals for the word line driver circuit 122. The word line driver circuit 122 has a function of driving the word line wwl and the word line rwl. The word line driver circuit 122 selects the word line wwl or the word line rwl of a row which is an access target, on the basis of a control signal of the row decoder 121.

In the case where the memory cell array 210 is divided into a plurality of blocks, a predecoder 123 may be provided. The predecoder 123 has a function of decoding the address signal ADDR and determining a block to be accessed.

The column decoder 131 and the bit line driver circuit 132 have a function of writing data input by the data signal WDATA to the memory cell array 210, a function of reading data from the memory cell array 210, a function of amplifying the read data and outputting the amplified data to the output circuit 140, and the like.

The output circuit 140 outputs, as the data signal RDATA, data read from the memory cell array 210 by the column decoder 131 and the bit line driver circuit 132.

In the example of FIG. 3, the bit line driver circuit 132 includes a precharge circuit 133, a sense amplifier circuit 134, an output MUX (multiplexer) circuit 135, and a write driver circuit 136. Note that the precharge circuit 133, the sense amplifier circuit 134, the output MUX circuit 135, and the write driver circuit 136 will be described later.

<Memory Cell Array>

Figure 4A:
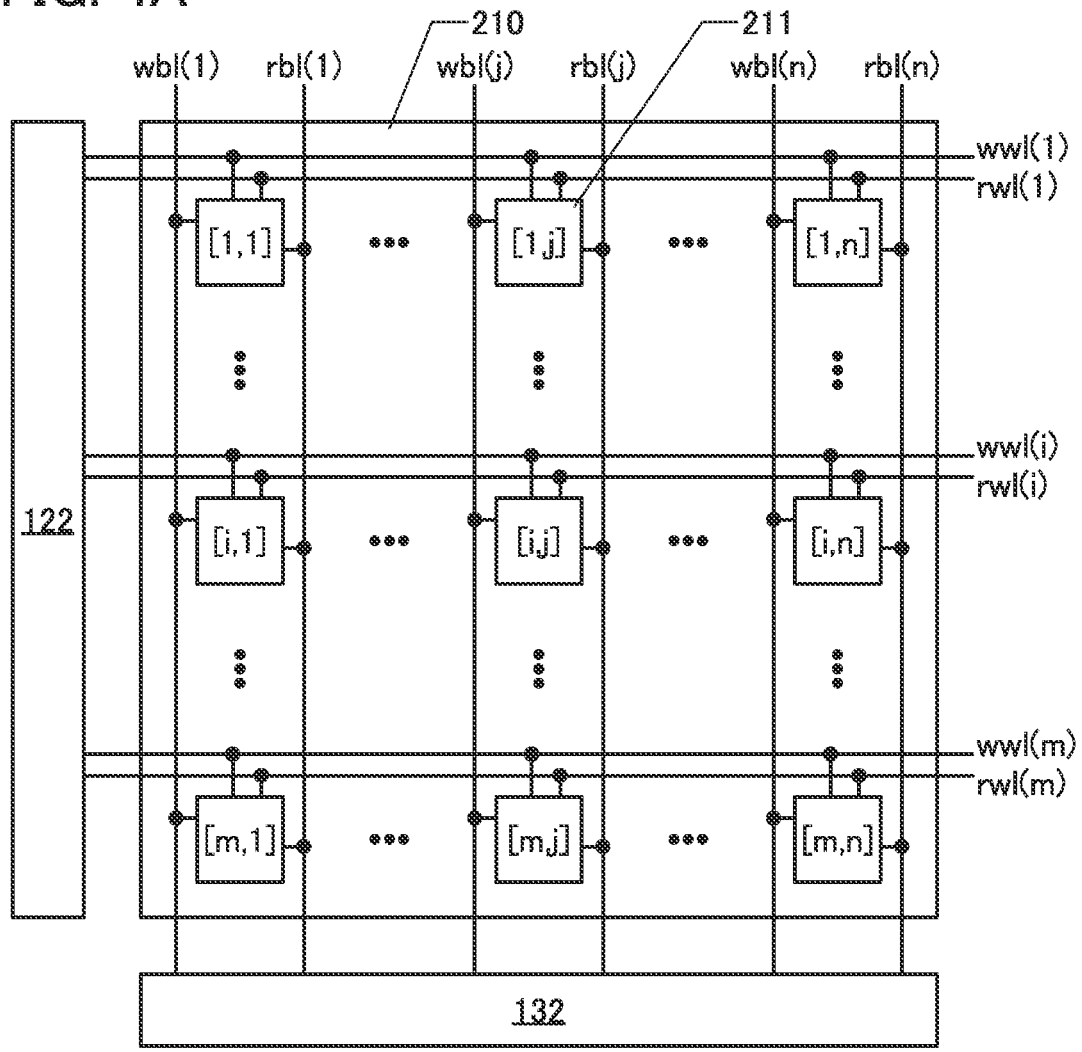
FIG. 4(A) is a diagram illustrating a memory cell array.

FIG. 4(A) illustrates a structure example of the memory cell array 210. The memory cell array 210 includes m×n memory cells 211 in total; m memory cells (m is an integer greater than or equal to 1) in a column and n memory cells (n is an integer greater than or equal to 1) in a row, and the memory cells 211 are arranged in a matrix.

The addresses of the memory cells 211 are also illustrated in FIG. 4(A), and [1,1], [i, 1], [m, 1], [1, j], [i, j], [m, j], [1, n], [i, n], and [m, n], (i is an integer greater than or equal to 1 and less than or equal to m, and j is an integer greater than or equal to 1 and less than or equal to n) are the addresses of the memory cells 211. For example, the memory cell 211 represented by [i,j] is the memory cell 211 in the i-th row and the j-th column.

Furthermore, the memory cell array 210 includes n bit lines wbl (wbl(1) to wbl(n)), n bit lines rbl (rbl(1) to rbl(n)), m word lines wwl (wwl(1) to wwl(m)), and m word lines rwl (rwl(1) to rwl(m)).

Each of the memory cells 211 is connected to the bit line wbl, the bit line rbl, the word line wwl, and the word line rwl. As illustrated in FIG. 4(A), the memory cell 211 whose address is [i, j] is electrically connected to the word line driver circuit 122 through the word line wwl(i) and the word line rwl(i) and is electrically connected to the bit line driver circuit 132 through the bit line wbl(j) and the bit line rbl(j).

<Memory Cell>

Figure 4B:
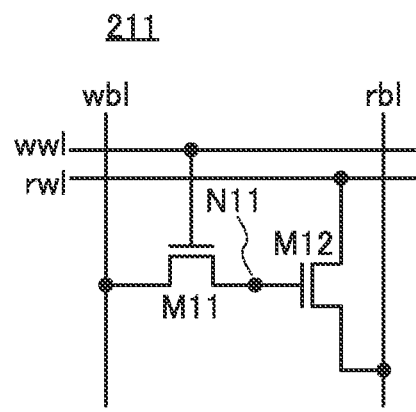
FIGS. 4(B) and 4(C) are circuit diagrams illustrating structure examples of memory cells.

FIG. 4(B) is a circuit diagram illustrating a structure example of the memory cell 211.

The memory cell 211 includes a transistor M11 and a transistor M12. One of a source and a drain of the transistor M11 is electrically connected to a gate of the transistor M12, the other of the source and the drain of the transistor M11 is connected to the bit line wbl, and a gate of the transistor M11 is connected to the word line wwl. One of a source and a drain of the transistor M12 is connected to the bit line rbl, and the other of the source and the drain of the transistor M12 is connected to the word line rwl. Here, the gate of the transistor M12 is referred to as a node N11.

Figure 4C:
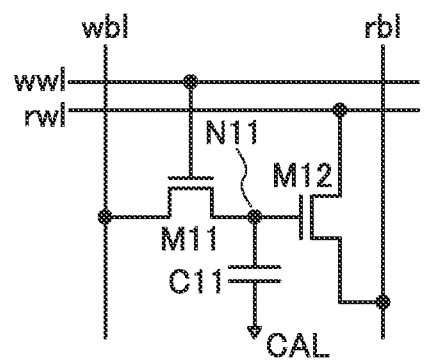

The memory cell 211 may further include a capacitor C11. FIG. 4(C) illustrates a structure example in the case where the memory cell 211 includes the capacitor C11. A first terminal of the capacitor C11 is electrically connected to the node N11, and a second terminal of the capacitor C11 is connected to a wiring CAL. The wiring CAL functions as a wiring for applying a predetermined potential to the second terminal of the capacitor C11.

The bit line wbl functions as a write bit line, the bit line rbl functions as a read bit line, the word line wwl functions as a write word line, and the word line rwl functions as a read word line. The transistor M11 has a function of a switch for controlling conduction or non-conduction between the node N11 and the bit line wbl.

Data writing is performed in such a manner that a high-level potential is applied to the word line wwl to bring the transistor M11 into a conduction state, and thus the node N11 and the bit line wbl are electrically connected. Specifically, when the transistor M11 is in a conduction state, a potential corresponding to data written to the bit line wbl is applied, and the potential is written to the node N11. After that, a low-level potential is applied to the word line wwl to bring the transistor M11 into a non-conduction state, whereby the potential of the node N11 is retained.

Data reading is performed in such a manner that a predetermined potential is applied to the bit line rbl, and after that, the bit line rbl is brought into an electrically floating state, and a low-level potential is applied to the word line rwl. Hereinafter, applying a predetermined potential to the bit line rbl to bring the bit line rbl into a floating state is expressed as precharging the bit line rbl.

For example, by precharging the potential Vdd to the bit line rbl, the transistor M12 has a potential difference between the source and the drain, and the current flowing between the source and the drain of the transistor M12 is determined depending on a potential retained at the node N11. Thus, the potential retained at the node N11 can be read by reading a change in potential of the bit line rbl at the time when the bit line rbl is in a floating state.

A row where the memory cells 211 to which data is to be written are arranged is selected by the word line wwl to which a high-level potential is applied, and a row where the memory cells 211 from which data is to be read are arranged is selected by the word line rwl to which a low-level potential is applied. In contrast, a row where the memory cells 211 to which data is not written are arranged can be in a non-selected state by applying a low-level potential to the word line wwl, and a row where the memory cells 211 from which data is not read are arranged can be in a non-selected state by applying, to the world line rwl, the same potential as a potential precharged to the bit line rbl.

Here, transistors containing a metal oxide in their channel formation regions (OS transistors) can be used as the transistor M11 and the transistor M12. For example, in the channel formation regions of the transistor M11 and the transistor M12, a metal oxide containing any one of an indium, an element M (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like), and zinc can be used. In particular, a metal oxide formed of indium, gallium, and zinc is preferable.

Since the OS transistor has extremely low off-state current, a potential written to the node N11 can be retained for a long time when the OS transistor is used as the transistor M11. In other words, data written to the memory cell 211 can be retained for a long time.

A transistor used as the transistor M12 is not particularly limited. Although an OS transistor, a Si transistor, or a different transistor may be used as the transistor M12, it is preferable that OS transistors be used as the transistor M12 and the transistor M11 in which case the memory cell array 210 can be stacked over the peripheral circuit 110.

The OS transistor has extremely low off-state current; thus, the memory cell 211 can have a structure not including the capacitor C11. In the case where the memory cell 211 does not include the capacitor C11, a potential written to the node N11 is retained by the gate capacitance of the transistor M12, or the like.

The memory cell 211 is a gain-cell memory cell composed of two transistors or composed of two transistors and one capacitor. A gain-cell memory cell can operate as a memory by amplifying accumulated charge by the closest transistor even when the capacitance of accumulated charge is small. The memory cell 211 is the above NOSRAM.

Figure 5A:
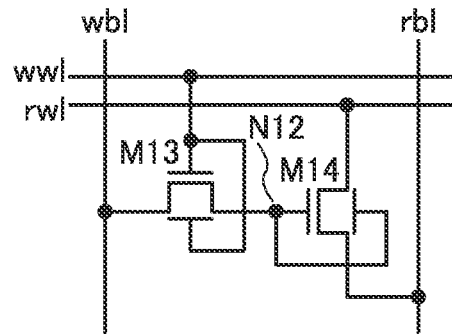
FIGS. 5(A), 5(B), 5(C), 5(D), 5(E), and 5(F) are circuit diagrams illustrating structure examples of memory cells.

The memory cell 211 may include a transistor M13 and a transistor M14 each including a back gate. FIG. 5(A) is a circuit diagram illustrating a structure example of a memory cell 212. The memory cell 212 includes the transistor M13 and the transistor M14. The transistor M13 and the transistor M14 each include a front gate and a back gate.

One of a source and a drain of the transistor M13 is electrically connected to the front gate and the back gate of the transistor M14, the other of the source and the drain of the transistor M13 is connected to the bit line wbl, and the front gate and the back gate of the transistor M13 are connected to the word line wwl. One of a source and a drain of the transistor M14 is connected to the bit line rbl, and the other of the source and the drain of the transistor M14 is connected to the word line rwl. Here, the front gate and the back gate of the transistor M14 are referred to as a node N12.

When each of the transistor M13 and the transistor M14 includes a back gate, the on-state current can be increased. That is, the memory cell 212 can operate at high speed.

Figure 5D:
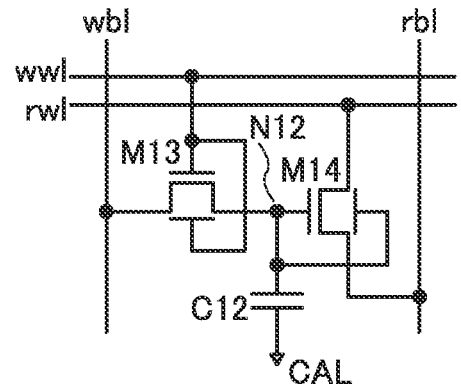
Figure 5B:
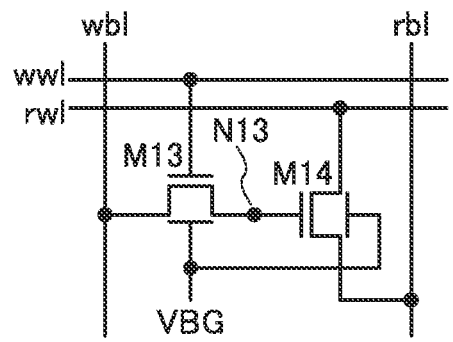

FIG. 5(B) is a circuit diagram illustrating a structure example of a memory cell 213. The memory cell 213 includes the transistor M13 and the transistor M14.

The one of the source and the drain of the transistor M13 is electrically connected to the front gate of the transistor M14, the other of the source and the drain of the transistor M13 is connected to the bit line wbl, and the front gate of the transistor M13 is connected to the word line wwl. The one of the source and the drain of the transistor M14 is connected to the bit line rbl, and the other of the source and the drain of the transistor M14 is connected to the word line rwl. The back gates of the transistor M13 and the transistor M14 are connected to a wiring VBG. The wiring VBG functions as a wiring for applying a predetermined potential to the back gates of the transistor M13 and the transistor M14. Here, the front gate of the transistor M14 is referred to as a node N13.

When a predetermined potential is applied to the back gates of the transistor M13 and the transistor M14 through the wiring VBG, the threshold voltages of the transistor M13 and the transistor M14 can be increased or decreased. Specifically, the threshold voltages negatively shift when a high potential is applied to the back gates of the transistor M13 and the transistor M14, and the threshold voltages positively shifts when a low potential is applied to the back gates of the transistor M13 and the transistor M14. By shifting the threshold voltages negatively, the on-state current of the transistors can be increased, and the memory cell 213 can operate at high speed. By shifting the threshold voltages positively, the off-state current of the transistors can be decreased, and the memory cell 213 can retain data for a long time.

Note that although the memory cell 213 illustrated in FIG. 5(B) has a structure in which the back gates of the transistor M13 and the transistor M14 are connected to the wiring VBG, the back gate of the transistor M13 and the back gate of the transistor M14 may be connected to different wirings. For example, with a structure in which the back gate of the transistor M13 is connected to a wiring VBG1 and the back gate of the transistor M14 is connected to a wiring VBG2, the off-state current of the transistor M13 can be decreased by applying a low potential to the wiring VBG1, and the on-state current of the transistor M14 can be increased by applying a high potential to the wiring VBG2. The transistor M13 and the transistor M14 can be transistors for desired purposes.

Figure 5E:
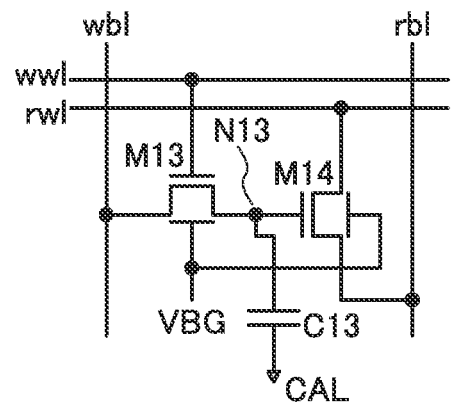
Figure 5C:
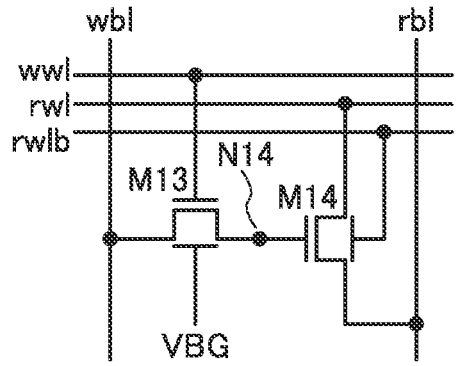

FIG. 5(C) is a circuit diagram illustrating a structure example of a memory cell 214. The memory cell 214 includes the transistor M13 and the transistor M14, which are connected to the word line rwlb in addition to the bit line wbl, the bit line rbl, the word line wwl, the word line rwl, and the wiring VBG.

The one of the source and the drain of the transistor M13 is electrically connected to the front gate of the transistor M14, the other of the source and the drain of the transistor M13 is connected to the bit line wbl, and the front gate of the transistor M13 is connected to the word line wwl. The one of the source and the drain of the transistor M14 is connected to the bit line rbl, and the other of the source and the drain of the transistor M14 is connected to the word line rwl. The back gate of the transistor M14 is connected to the word line rwlb, and the back gate of the transistor M13 is connected to the wiring VBG. The wiring VBG functions as a wiring for applying a predetermined potential to the back gate of the transistor M13, and the front gate of the transistor M14 is referred to as a node N14.

The description of the memory cell 213 is referred to for the wiring VBG. The transistor M13 can be replaced with a transistor not including a back gate.

The word line rwlb is driven by the word line driver circuit 122, like the word line wwl and the word line rwl. The word line driver circuit 122 can increase the on-state current of the transistor M14 in reading operation by applying a high potential to the word line rwlb of a row which is a reading target. In contrast, the off-state current of the transistor M14 which is not subjected to reading operation can be decreased by applying a low potential to the world line rwlb of a row other than a row which is a reading target.

Figure 5F:
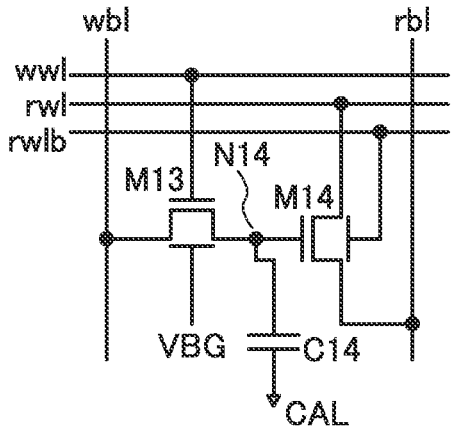

The memory cell 212, the memory cell 213, and the memory cell 214 may include a capacitor C12, a capacitor C13, and a capacitor C14, respectively. FIG. 5(D) illustrates a structure example in the case where the memory cell 212 includes the capacitor C12, FIG. 5(E) illustrates a structure example in the case where the memory cell 213 includes the capacitor C13, and FIG. 5(F) illustrates a structure example in the case where the memory cell 214 includes the capacitor C14. Note that since they are similar to the structure example in the case where the memory cell 211 includes the capacitor C11, the description of the memory cell 211 is referred to.

<Structure Example of Bit Line Driver Circuit>

Figure 6:
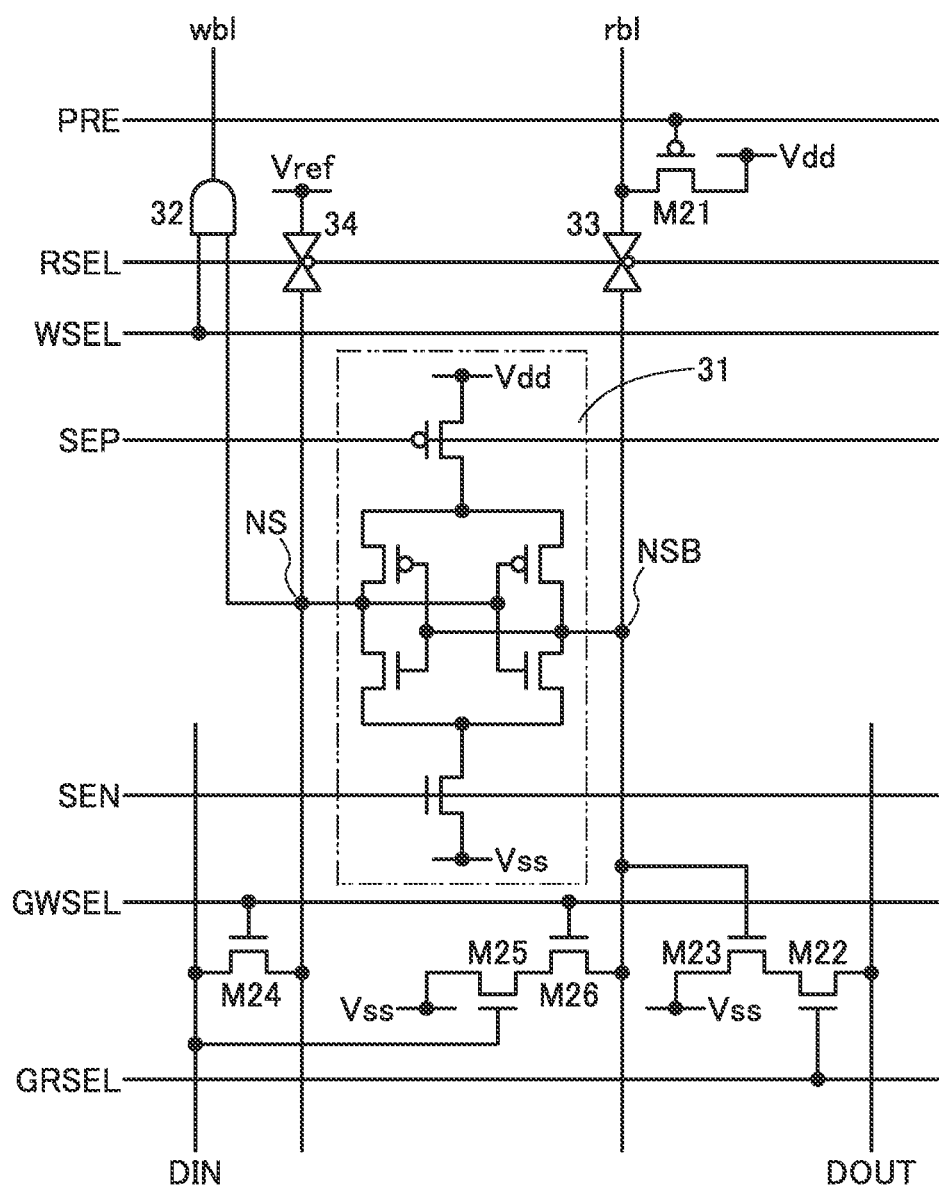
FIG. 6 is a diagram illustrating a circuit forming a bit line driver circuit.

In the bit line driver circuit 132, a circuit 137 illustrated in FIG. 6 is provided for each column. FIG. 6 is a circuit diagram illustrating a structure example of the circuit 137. Note that in this example, the memory cell array 210 includes 128 memory cells 211 in one row (n=128).

The circuit 137 includes a transistor M21 to a transistor M26, a sense amplifier circuit 31, an AND circuit 32, an analog switch 33, and an analog switch 34.

The circuit 137 operates in response to a signal SEN[3:0], a signal SEP[3:0], a signal PRE, a signal RSEL[3:0], a signal WSEL, a signal GRSEL[3:0], and a signal GWSEL[15:0]. Note that a 1-bit signal of any of the 4-bit signal SEN[3:0] is input to one circuit 137. The same applies to the other signals having a plurality of bits (SEP[3:0] and the like).

The bit line driver circuit 132 writes data DIN[31:01] to the memory cell array 210 and reads data DOUT[31:0] from the memory cell array 210. One circuit 137 has a function of writing 1-bit data of any of the 32-bit data DIN[31:0] to the memory cell array 210 and reading 1-bit data of any of the 32-bit data DOUT[31:0] from the memory cell array 210.

Note that the data DIN [31:0] and the data DOUT [31:0] are internal signals and correspond to the data signal WDATA and the data signal RDATA, respectively.

<<Precharge Circuit>>

The transistor M21 forms the precharge circuit 133. The bit line rbl is precharged to the potential Vdd by the transistor M21. The signal PRE is a precharge signal, and the conduction state of the transistor M21 is controlled by the signal PRE.

<Sense Amplifier Circuit>

The sense amplifier circuit 31 forms the sense amplifier circuit 134. In reading operation, the sense amplifier circuit 31 determines whether data input to the bit line rbl is at a high level or a low level. In addition, the sense amplifier circuit 31 functions as a latch circuit that temporarily retains the data DIN input from the write driver circuit 136 in writing operation.

The sense amplifier circuit 31 illustrated in FIG. 6 is a latch sense amplifier. The sense amplifier circuit 31 includes two inverter circuits, and an input node of one of the inverter circuits is connected to an output node of the other of the inverter circuits. When the input node of the one of the inverter circuits is a node NS and the output node is a node NSB, complementary data is retained in the node NS and the node NSB.

The signal SEN and the signal SEP are each a sense amplifier enable signal for activating the sense amplifier circuit 31, and the reference potential Vref is a read judge potential. The sense amplifier circuit 31 determines whether the potential of the node NSB at the time of the activation is at high level or a low level on the basis of the reference potential Vref.

The AND circuit 32 controls electrical continuity between the node NS and the bit line wbl. The analog switch 33 controls electrical continuity between the node NSB and the bit line rbl, and the analog switch 34 controls electrical continuity between the node NS and a wiring for supplying the reference potential Vref.

The signal WSEL is a write selection signal, which controls the AND circuit 32. The signal RSEL[3:0] is a read selection signal, which controls the analog switch 33 and the analog switch 34.

<<Output MUX Circuit>>

The transistor M22 and the transistor M23 form the output MUX circuit 135. The signal GRSEL[3:0] is a global read selection signal and controls the output MUX circuit 135. The output MUX circuit 135 has a function of selecting, from 128 bit lines rbl, 32 bit lines rbl from which data is to be read. The output MUX circuit 135 functions as a multiplexer of 128 input and 32 output.

The output MUX circuit 135 reads the data DOUT [31:0] from the sense amplifier circuit 134 and outputs the data to the output circuit 140.

<<Write Driver Circuit>>

The transistor M24 to the transistor M26 form the write driver circuit 136. The signal GWSEL[15:0] is a global write selection signal and controls the write driver circuit 136. The write driver circuit 136 has a function of writing the data DIN[31:0] to the sense amplifier circuit 134.

The write driver circuit 136 has a function of selecting a column where the data DIN[31:0] is to be written. The write driver circuit 136 writes data in byte units, half-word units, or word units in response to the signal GWSEL[15:0].

The circuit 137 is electrically connected to the data DIN[k] (k is an integer greater than or equal to 0 and less than or equal to 31) in every four columns. In addition, the circuit 137 is electrically connected to the data DOUT[k] in every four columns.

<Operation Example of Memory Cell>

Figure 7:
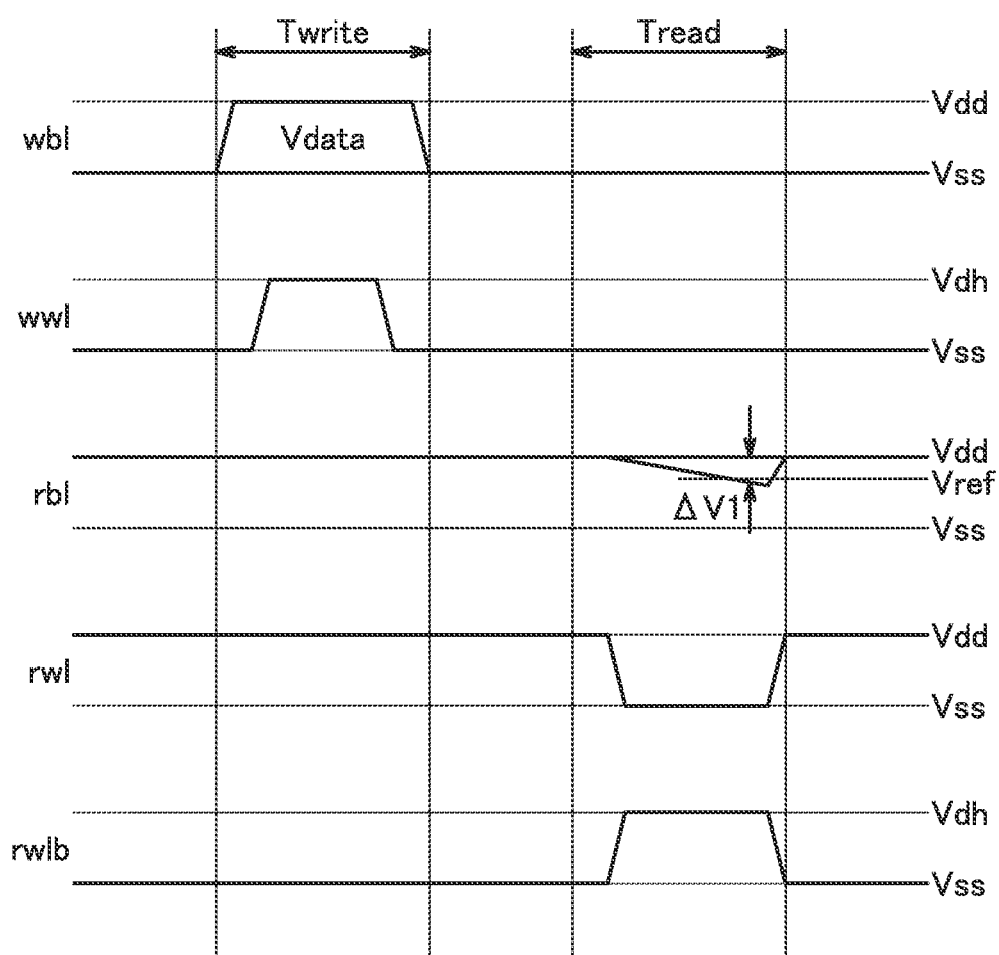
FIG. 7 is a timing chart showing an operation example of a memory cell.

FIG. 7 is a timing chart showing an operation example of the memory cell 211. In FIG. 7, the relation between potentials of the word line wwl, the word line rwl, the bit line wbl, and the bit line rbl in writing operation and reading operation of the memory cell 211 will be described. Moreover, the word line rwlb to which the memory cell 214 is connected will be described later.

In FIG. 7, Period Twrite is a period during which writing operation is performed, and Period Tread is a period during which reading operation is performed. A potential of each of the word line rwl, the bit line wbl, and the bit line rbl at high level is the potential Vdd, and a potential thereof at a low level is the potential Vss. A potential of the word line wwl at high level is the potential Vdh, and a potential of the word line wwl at low level is the potential Vss.

<<Write Operation>>

In Period Twrite, a potential Vdata corresponding to data to be written is applied to the bit line wbl. When the potential Vdh is applied to the word line wwl of a row where the memory cells 211 to which the data is to be written are arranged in a state where the potential Vdata corresponding to the data to be written is applied to the bit line wbl, the transistor M11 is brought into a conduction state, and the potential Vdata corresponding to the data to be written is written to the node N11.

Furthermore, in Period Twrite, the potential Vdd is applied to the bit line rbl and the word line rwl.

<<Reading Operation>>

In Period Tread, the bit line rbl is precharged with the potential Vdd. When the potential Vss is applied to the word line rwl of a row where the memory cells 211 from which data is to be read are arranged in a state where the bit line rbl is in a floating state, in the case where the data written to the node N11 is at a high level, the transistor M12 is brought into a conduction state, and the potential of the bit line rbl starts to be decreased.

When the potential of the bit line rbl is decreased by $\Delta V1$ and becomes lower than the reference potential Vref, the sense amplifier circuit 31 determines that the bit line rbl is at a low level.

In the case where the data written to the node N11 is at a low level even when the potential Vss is applied to the word line rwl of a row where the memory cells 211 from which data is to be read are arranged in a state where the bit line rbl is in a floating state, the transistor M12 is not brought into a conduction state, and thus the potential of the bit line rbl is not changed. In this case, the sense amplifier circuit 31 determines that the bit line rbl is at a high level.

In Period Tread, the potential Vss is applied to the bit line wbl and the word line wwl.

As for the word line rwlb to which the memory cell 214 is connected, for example, a potential of the word line rwlb at a high level can be the potential Vdh, and a potential of the word line rwlb at a low level can be the potential Vss.

In Period Twrite, the potential Vss is applied to the word line rwlb, and in Period Tread, the potential Vdh is applied to the word line rwlb of a row where the memory cells 214 from which data is to be read are arranged.

When the potential Vdh is applied to the word line rwlb, the on-state current of the transistor M14 included in the memory cell 214 from which data is to be read can be increased. Furthermore, when the potential Vss is applied to the word line rwlb, the off-state current of the transistor M14 can be reduced.

As described above, the memory device 100 includes a gain-cell memory cell formed using an n-channel transistor, and the high level and the low level of the word line wwl, the word line rwl, the bit line wbl, and the bit line rbl are represented by three kinds of potentials, the potential Vss, the potential Vdd, and the potential Vdh. In other words, a potential lower than the low-level potential Vss applied to the bit line wbl and the bit line rbl is unnecessary, and thus the memory device 100 can be operated with a small number of power sources. The cost of an electronic device including the memory device 100 can be reduced.

Furthermore, when all the transistors included in the memory cell 211 are OS transistors, the memory cell array 210 can be stacked over the peripheral circuit 110. Thus, the chip area of the memory device 100 can be reduced.

Note that this embodiment can be implemented in combination with the other embodiments described in this specification as appropriate.

Embodiment 2

In this embodiment, an example in which the memory device described in the above embodiment includes a serial peripheral interface (SPI) will be described. The serial peripheral interface is one of serial interfaces used for communication between semiconductor devices that input/output a digital signal and has a feature that the number of terminals required for input/output of a signal can be small. For example, it is used for communication between a CPU (Central Processing Unit) and a memory device.

<Block Diagram of Memory Device>

Figure 8:
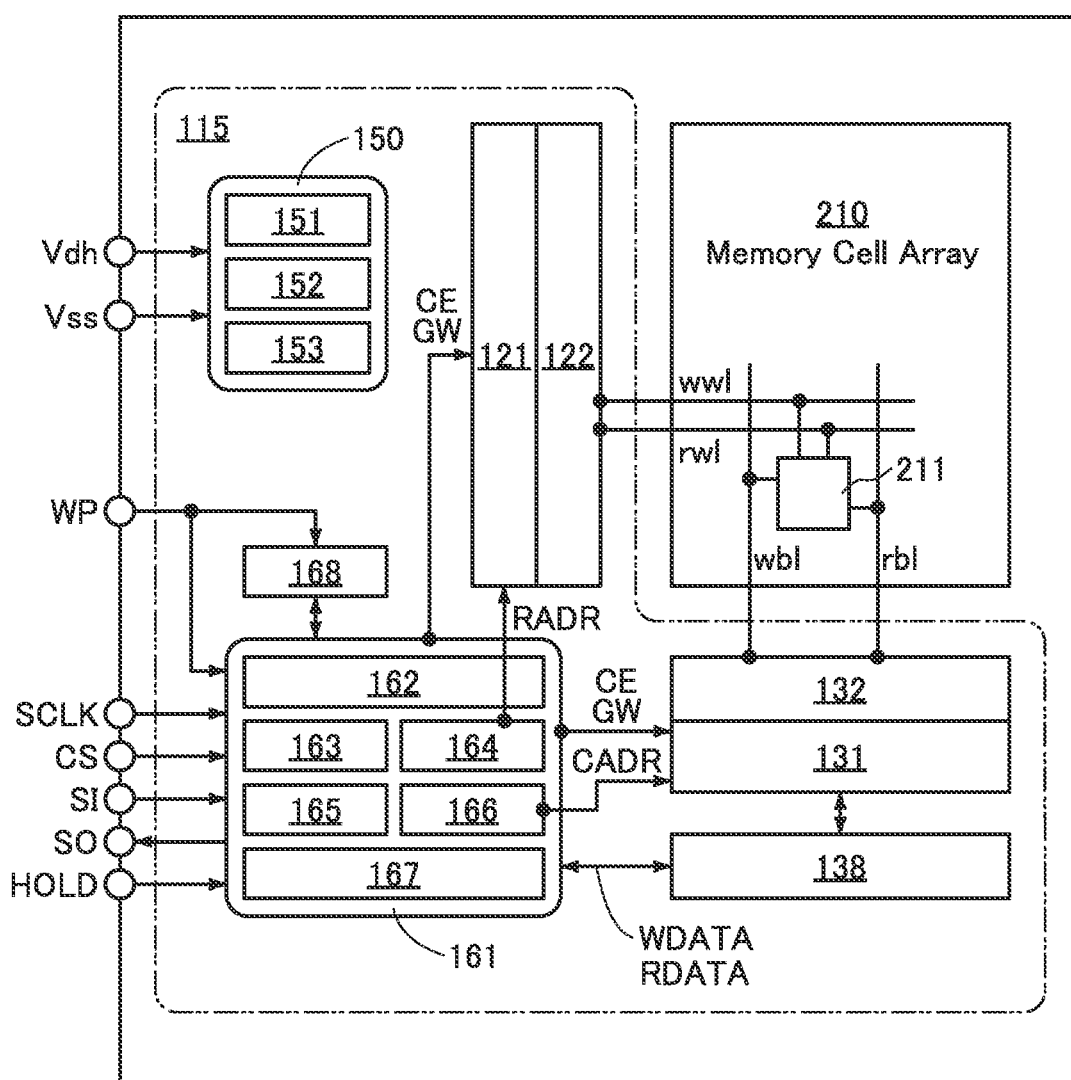
FIG. 8 is a block diagram illustrating a structure example of a memory device.

FIG. 8 is a block diagram illustrating a structure example of a memory device 105. The memory device 105 includes a peripheral circuit 115 and the memory cell array 210. As in the memory device 100 described in the above embodiment, in the memory device 105, the peripheral circuit 115 is formed using a Si transistor, the memory cell array 210 includes the plurality of memory cells 211, and the memory cells 211 are formed using OS transistors.

The peripheral circuit 115 includes the row decoder 121, the word line driver circuit 122, the column decoder 131, the bit line driver circuit 132, a page buffer 138, a potential generation circuit 150, an SPI controller 161, and a status register 168. The memory cell array 210 includes the memory cell 211, the word line wwl, the word line rwl, the bit line wbl, and the bit line rbl.

Note that the descriptions of the memory cell array 210, the row decoder 121, the word line driver circuit 122, the column decoder 131, and the bit line driver circuit 132 are omitted because the descriptions are similar to those in the above embodiment.

The potential Vss and the potential Vdh are input to the memory device 105. A clock signal SCLK, a chip select signal CS, a data input signal SI, a data output signal SO, a hold signal HOLD, and a write protection signal WP are input to the memory device 105.

The potential generation circuit 150 includes a regulator 151, a regulator 152, and a power switch 153. On the basis of the potential Vss and the potential Vdh input to the memory device 105, the regulator 151 can generate the potential Vdd, the regulator 152 can generate the reference potential Vref, and the power switch 153 can control output of the potential Vdh.

The potential generation circuit 150 has a function of supplying the potential Vdh, the potential Vdd, and the potential Vss to the peripheral circuit 115. For example, the potential Vdh can be set to 3.3 V, the potential Vdd can be set to 1.2 V, and the potential Vss can be set to 0 V (GND).

In the case where the memory cell 211 is formed using a transistor including a back gate, the potential generation circuit 150 may have a function of generating and supplying a potential to be applied to the back gate.

The SPI controller 161 includes a serial-parallel convertor 162, an instruction decoder circuit 163, a page address generation circuit 164, a command generation circuit 165, a byte address generation circuit 166, and a parallel-serial converter 167.

The SPI controller 161 processes a signal input to the memory device 105 and outputs the chip enable signal CE and the global write enable signal GW to the row decoder 121 and the column decoder 131.

For example, in the case where the chip enable signal CE is at a high level and the global write enable signal GW is at a low level, the row decoder 121 and the column decoder 131 perform reading operation; in the case where the chip enable signal CE is at a high level and the global write enable signal GW is at a high level, the row decoder 121 and the column decoder 131 perform writing operation; and in the case where the chip enable signal CE is at a low level, the row decoder 121 and the column decoder 131 can perform standby operation regardless of whether the global write enable signal GW is at a high level or a low level.

The SPI controller 161 processes a signal input to the memory device 105 and outputs the write data signal WDATA to the page buffer 138. The page buffer 138 outputs, to the SPI controller 161, the read data signal RDATA read from the memory cell array 210.

Furthermore, the page address generation circuit 164 outputs a row address signal RADR to the row decoder 121, and the byte address generation circuit 166 outputs a column address signal CADR to the column decoder 131. The memory cell 211 subjected to reading or writing is determined by the row address signal RADR and the column address signal CADR.

The page buffer 138 has a function of temporarily storing a data signal to be read or written, and the status register 168 is a memory that stores an operation mode of the SPI controller 161.

When the storage capacity of the page buffer 138 is 256 bytes (2048 bits), and the memory cell array 210 includes 2048 memory cells 211 in one row and 1024 memory cells 211 in one column, for example, the memory device 105 can have a capacity of 256 Kbyte.

The write protection signal WP is a signal that prevents writing to the status register 168, and the hold signal HOLD is a signal that temporarily stops the operation of the memory device 105.

Note that a signal processed by the SPI controller 161 is not limited to the above, and a different signal may be input or output as necessary.

This embodiment can be implemented in combination with the other embodiments described in this specification as appropriate.

Embodiment 3

Structure examples of the Si transistor that is applicable to the peripheral circuit 110 and the OS transistor that is applicable to the memory cell 211 described in the above embodiment will be described in this embodiment. Note that the Si transistor and the OS transistor are collectively referred to as a semiconductor device in this embodiment.
<Structure Example of Semiconductor Device>

Figure 9:
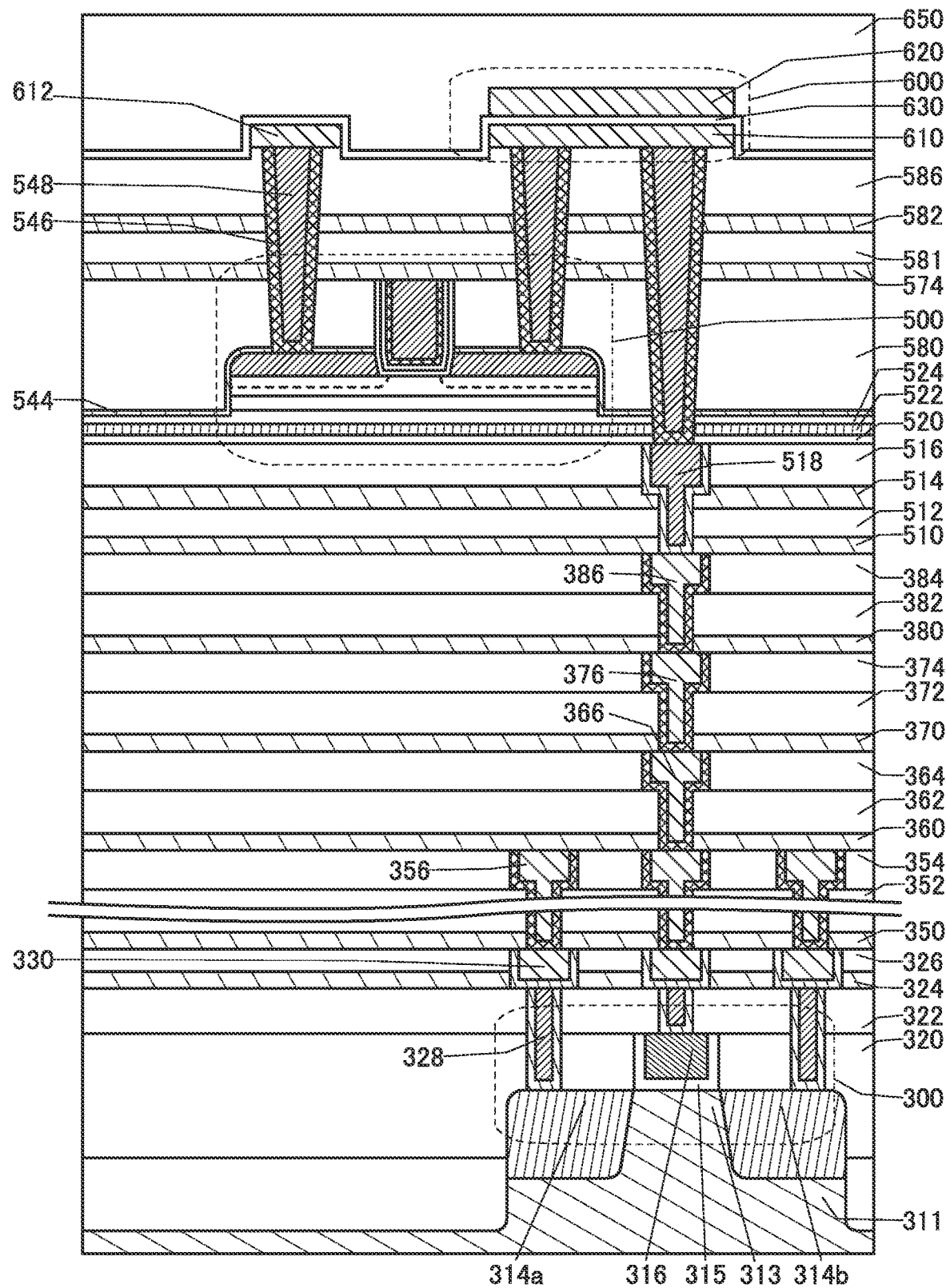
FIG. 9 is a cross-sectional view illustrating a structure example of a semiconductor device.
Figure 10A:
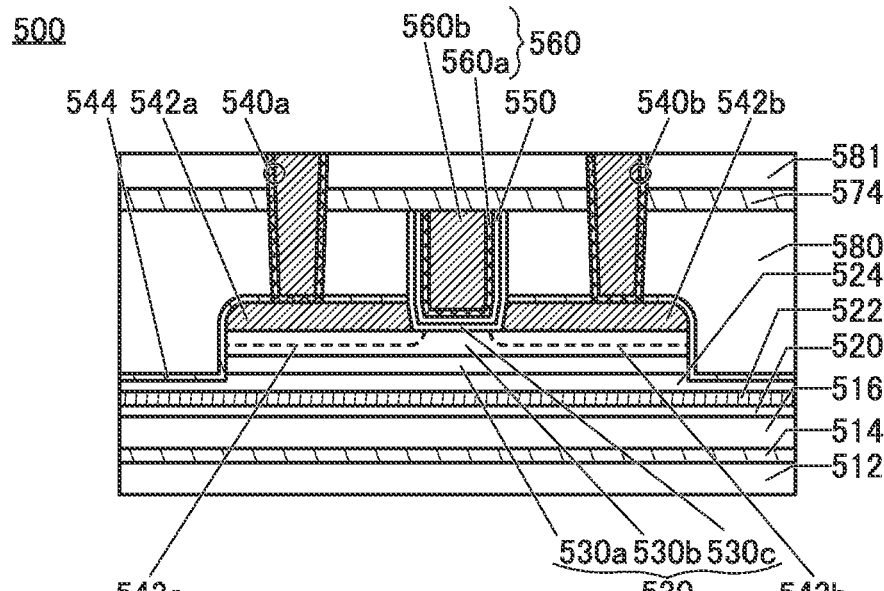
FIGS. 10(A), 10(B), and 10(C) are cross-sectional views illustrating structure examples of transistors.
Figure 10B:
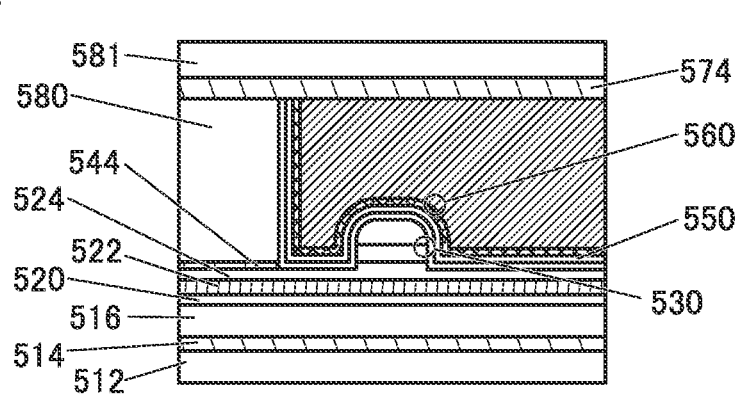
Figure 10C:
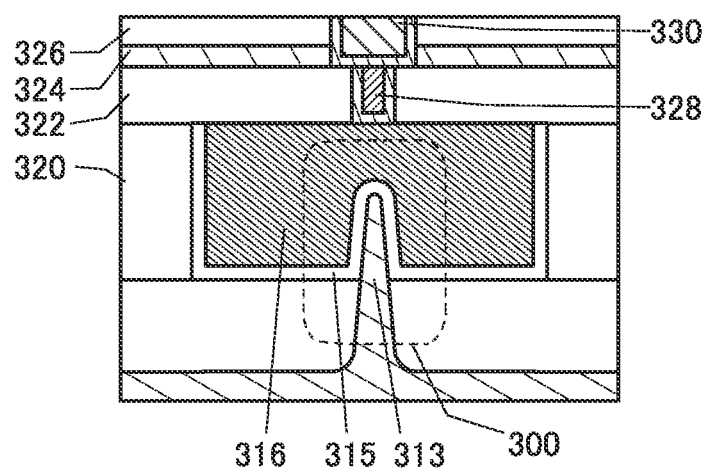

A semiconductor device illustrated in FIG. 9 includes a transistor 300, a transistor 500, and a capacitor 600. FIG. 10(A) is a cross-sectional view of the transistor 500 in the channel length direction, FIG. 10(B) is a cross-sectional view of the transistor 500 in the channel width direction, and FIG. 10(C) is a cross-sectional view of the transistor 300 in the channel width direction.

The transistor 500 is a transistor containing a metal oxide in its channel formation region (OS transistor). Since the off-state current of the transistor 500 is low, a semiconductor device using such a transistor can retain stored data for a long time. Alternatively, the capacitance of accumulated charge can be small.

The semiconductor device described in this embodiment includes the transistor 300, the transistor 500, and the capacitor 600 as illustrated in FIG. 9. The transistor 500 is provided above the transistor 300, and the capacitor 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As illustrated in FIG. 10(C), in the transistor 300, the top surface and a side surface in the channel width direction of the semiconductor region 313 are covered with the conductor 316 with the insulator 315 therebetween. The effective channel width is increased in the Fin-type transistor 300, whereby the on-state characteristics of the transistor 300 can be improved. In addition, since contribution of an electric field of the gate electrode can be increased, the off-state characteristics of the transistor 300 can be improved.

Note that the transistor 300 can be a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 illustrated in FIG. 9 is just an example and the structure is not limited thereto; an appropriate transistor can be used in accordance with a circuit structure or a driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 300 or the like provided below the insulator 322. For example, the top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 function as a plug or a wiring. A plurality of conductors functioning as plugs or wirings are collectively denoted by the same reference numeral in some cases. Furthermore, in this specification and the like, a wiring and a plug connected to the wiring may be a single component. That is, there are cases where part of a conductor functions as a wiring and another part of the conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 9, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 300 and the transistor 500 can be separated by a barrier layer, so that the diffusion of hydrogen from the transistor 300 into the transistor 500 can be inhibited.

Note that for the conductor having a barrier property against hydrogen, tantalum nitride is preferably used, for example. The use of a stack including tantalum nitride and tungsten having high conductivity can inhibit the diffusion of hydrogen from the transistor 300 while the conductivity of a wiring is kept. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 9, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 364 and the conductor 366. For example, in FIG. 9, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 374 and the conductor 376. For example, in FIG. 9, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 and the transistor 500 can be separated by a barrier layer, so that the diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents diffusion of hydrogen or impurities from the substrate 311, the region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. When a material with a relatively low permittivity is used for an interlayer film, the parasitic capacitance between wirings can be reduced. Silicon oxide films, silicon oxynitride films, or the like can be used as the insulator 512 and the insulator 516, for example.

A conductor 518 and the like are embedded in the insulator 510, the insulator 512, the insulator 514, and the insulator 516. Note that the conductor 518 functions as a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided above the insulator 516.

As illustrated in FIGS. 10(A) and 10(B), the transistor 500 includes an insulator 520 positioned over the insulator 516; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

As illustrated in FIGS. 10(A) and 10(B), an insulator 544 is preferably positioned between the insulator 580 and the oxide 530a, the oxide 530b, the conductor 542a, and the conductor 542b. In addition, as illustrated in FIGS. 10(A) and 10(B), the conductor 560 preferably includes a conductor 560a provided inside the insulator 550 and a conductor 560b embedded inside the conductor 560a. Moreover, as illustrated in FIGS. 10(A) and 10(B), an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

The transistor 500 has a structure in which three layers of the oxide 530a, the oxide 530b, and the oxide 530c are stacked in the region where the channel is formed and its vicinity; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be provided. Although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 9 and FIGS. 10(A) and 10(B) is an example, and the structure is not limited thereto;

an appropriate transistor can be used in accordance with a circuit structure or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping the conductor 542a or the conductor 542b. Thus, parasitic capacitance formed between the conductor 560 and each of the conductor 542a and the conductor 542b can be reduced. As a result, the transistor 500 can have improved switching speed and excellent frequency characteristics.

The insulator 550 has a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 400° C.

In the case where the insulator 524 includes an excess-oxygen region, it is preferred that the insulator 522 have a function of inhibiting diffusion of oxygen (e.g., an oxygen atom, an oxygen molecule, or the like) (the oxygen is less likely to pass).

When the insulator 522 has a function of inhibiting diffusion of oxygen or impurities, oxygen contained in the oxide 530 is not diffused to the insulator 520 side, which is preferable.

For example, the insulator 522 is preferably formed using a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba, Sr)TiO$_3$ (BST). With miniaturization and high integration of transistors, a problem such as leakage current may arise because of a thinner gate insulating film. When a high-k material is used for an insulator functioning as the gate insulating film, a gate potential during operation of the transistor can be reduced while the physical thickness is maintained.

It is particularly preferable to use an insulator containing an oxide of one or both of aluminum and hafnium, which is an insulating material having a function of inhibiting diffusion of impurities, oxygen, and the like (the oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator which is a high-k material is combined with silicon oxide or silicon oxynitride, the insulator 520 having a stacked-layer structure that has thermal stability and a high dielectric constant can be obtained.

Note that the insulator 520, the insulator 522, and the insulator 524 may each have a stacked-layer structure of two or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In—M—Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of oxides that differ in the atomic ratio of metal atoms. Specifically, the atomic ratio of the element M to the constituent elements in the metal oxide used for the oxide 530a is preferably greater than the atomic ratio of the element M to the constituent elements in the metal oxide used for the oxide 530b. Moreover, the atomic ratio of the element M to In in the metal oxide used for the oxide 530a is preferably greater than the atomic ratio of the element M to In in the metal oxide used for the oxide 530*b*. Furthermore, the atomic ratio of In to the element M in the metal oxide used for the oxide 530*b* is preferably greater than the atomic ratio of In to the element M in the metal oxide used for the oxide 530*a*. A metal oxide that can be used for the oxide 530*a* or the oxide 530*b* can be used for the oxide 530*c*.

The energy of the conduction band minimum of each of the oxide 530*a* and the oxide 530*c* is preferably higher than the energy of the conduction band minimum of the oxide 530*b*. In other words, the electron affinity of each of the oxide 530*a* and the oxide 530*c* is preferably smaller than the electron affinity of the oxide 530*b*.

The energy level of the conduction band minimum gradually changes at junction portions of the oxide 530*a*, the oxide 530*b*, and the oxide 530*c*. In other words, the energy level of the conduction band minimum at the junction portions of the oxide 530*a*, the oxide 530*b*, and the oxide 530*c* continuously changes or is continuously connected. To obtain this, the density of defect states in a mixed layer formed at an interface between the oxide 530*a* and the oxide 530*b* and an interface between the oxide 530*b* and the oxide 530*c* is preferably made low.

Specifically, when the oxide 530*a* and the oxide 530*b* or the oxide 530*b* and the oxide 530*c* contain the same element (as a main component) in addition to oxygen, a mixed layer with a low density of defect states can be formed. For example, in the case where the oxide 530*b* is an In—Ga—Zn oxide, an In—Ga—Zn oxide, a Ga—Zn oxide, gallium oxide, or the like is preferably used for the oxide 530*a* and the oxide 530*c*.

At this time, the oxide 530*b* serves as a main carrier path. When the oxide 530*a* and the oxide 530*c* have the above structure, the density of defect states at the interface between the oxide 530*a* and the oxide 530*b* and the interface between the oxide 530*b* and the oxide 530*c* can be made low. Thus, the influence of interface scattering on carrier conduction is small, and the transistor 500 can have a high on-state current.

The conductor 542 (the conductor 542*a* and the conductor 542*b*) functioning as the source electrode and the drain electrode is provided over the oxide 530*b*. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 10(A), a region 543 (a region 543*a* and a region 543*b*) is sometimes formed as a low-resistance region at and near the interface between the oxide 530 and the conductor 542. In that case, the region 543*a* functions as one of a source region and a drain region, and the region 543*b* functions as the other of the source region and the drain region. The channel formation region is formed in a region between the region 543*a* and the region 543*b*.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier density of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or does not significantly lose its conductivity even after absorbing oxygen. Design is appropriately set in consideration of required transistor characteristics.

The insulator 550 functions as a gate insulating film. The insulator 550 is preferably positioned in contact with the inner side (the top surface and the side surface) of the oxide 530*c*. The insulator 550 is preferably formed using an insulator from which oxygen is released by heating. An oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy analysis (TDS analysis) is used, for example. Note that the temperature of the film surface in the TDS analysis is preferably higher than or equal to 100° C. and lower than or equal to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

When an insulator from which oxygen is released by heating is provided as the insulator 550 in contact with the top surface of the oxide 530*c*, oxygen can be efficiently supplied from the insulator 550 to the channel formation region of the oxide 530*b* through the oxide 530*c*. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be inhibited. For the metal oxide, a material that can be used for the insulator 544 is used.

Although the conductor 560 functioning as a gate electrode has a two-layer structure in FIGS. 10(A) and 10(B), a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting oxygen diffusion, it is possible to prevent a reduction in conductivity of the conductor 560b due to oxidation caused by oxygen contained in the insulator 550. As a conductive material having a function of inhibiting oxygen diffusion, for example, tantalum, tantalum nitride, ruthenium, ruthenium oxide, or the like is preferably used.

The conductor 560b is preferably formed using a conductive material containing tungsten, copper, or aluminum as its main component. The conductor 560b also functions as a wiring and thus is preferably formed using a conductor having high conductivity. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide, in which an excess-oxygen region can be easily formed in a later step, are preferable.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably lowered.

The opening of the insulator 580 is formed to overlap with a region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; hence, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water or hydrogen in the insulator 581 is preferably lowered.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low permittivity is used for an interlayer film, the parasitic capacitance between wirings can be reduced. For example, a silicon oxide film, a silicon oxynitride film, or the like can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using a material similar to those for the conductor 328 and the conductor 330.

In addition, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each of which has a single-layer structure are illustrated in FIG. 9, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with low power consumption can be provided. Alternatively, a semiconductor device using a transistor including an oxide semiconductor can be miniaturized or highly integrated.

<Transistor Structure Examples>

Note that the structure of the transistor 500 in the semiconductor device described in this embodiment is not limited to the above. Examples of structures that can be used for the transistor 500 will be described below.

<Transistor Structure Example 1>

Figure 11A:
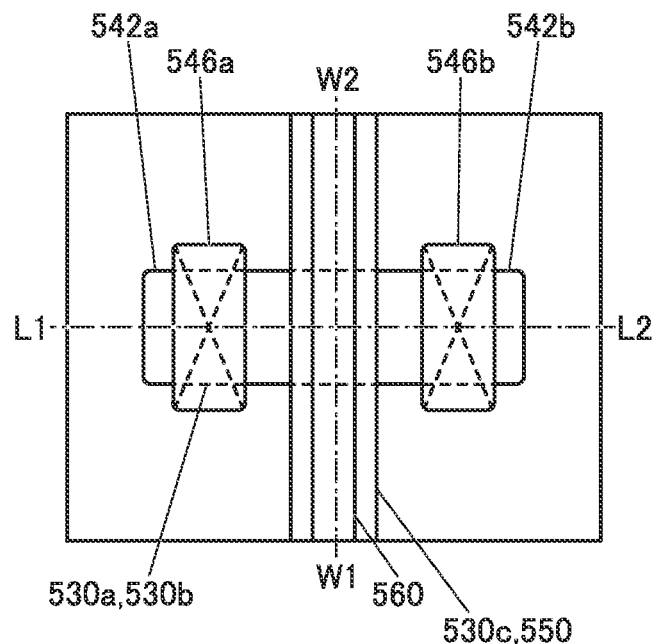
FIG. 11(A) is a top view illustrating a structure example of a transistor.
Figure 11C:
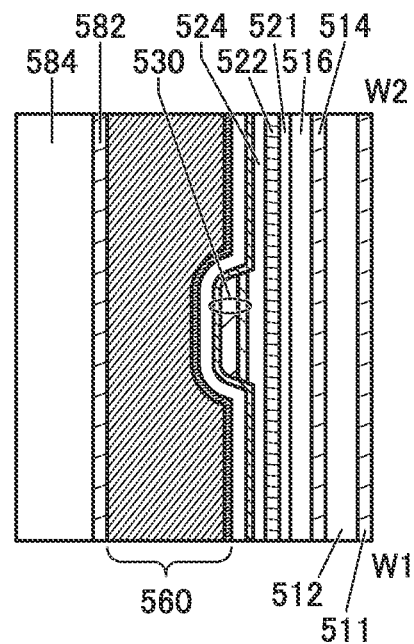
FIGS. 11(B) and 11(C) are cross-sectional views illustrating the structure example of the transistor.
Figure 11B:
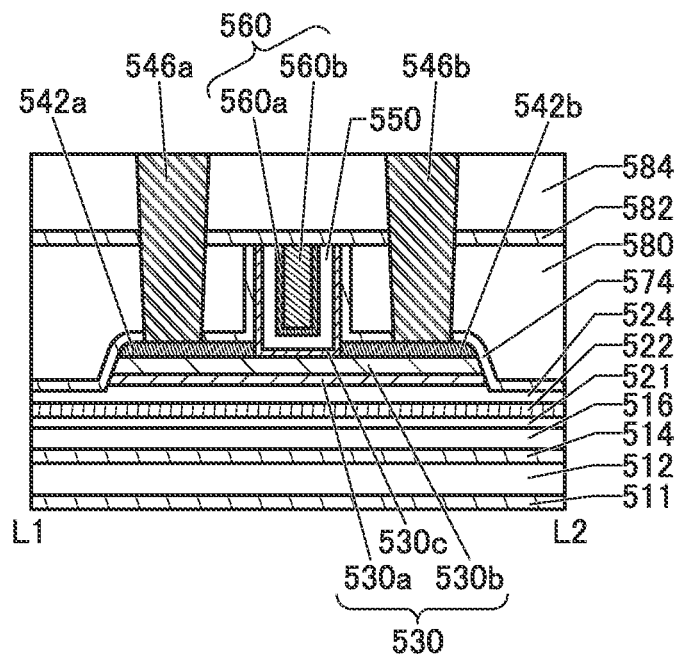

A structure example of a transistor 510A is described with reference to FIGS. 11(A), 11(B), and 11(C). FIG. 11(A) is a top view of the transistor 510A. FIG. 11(B) is a cross-sectional view of a portion indicated by a dashed-dotted line L1-L2 in FIG. 11(A). FIG. 11(C) is a cross-sectional view of a portion indicated by a dashed-dotted line W1-W2 in FIG. 11(A). Note that for clarification of the drawing, some components are not illustrated in the top view of FIG. 11(A).

FIGS. 11(A), 11(B), and 11(C) illustrate a transistor 510A and the insulator 511, the insulator 512, the insulator 514, the insulator 516, the insulator 580, the insulator 582, and an insulator 584 that function as interlayer films. In addition, conductor 546 (a conductor 546a and a conductor 546b) that is electrically connected to the transistor 510A and functions as a contact plug is illustrated.

The transistor 510A includes the conductor 560 (the conductor 560a and the conductor 560b) functioning as a gate electrode; the insulator 550 functioning as a gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A illustrated in FIG. 11, the oxide 530c, the insulator 550, and the conductor 560 are positioned in an opening provided in the insulator 580 with the insulator 574 positioned therebetween. Moreover, the oxide 530c, the insulator 550, and the conductor 560 are positioned between the conductor 542a and the conductor 542b.

The insulator 511 and the insulator 512 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities do not easily pass). Alternatively, it is preferable to use an insulating material that has a function of inhibiting diffusion of oxygen (e.g., at least one of oxygen atoms, oxygen molecules, and the like) (through which the above oxygen does not easily pass). Moreover, aluminum oxide or silicon nitride, for example, may be used for the insulator 511. This structure can inhibit diffusion of impurities such as hydrogen and water to the transistor 510A side from the substrate side of the insulator 511.

For example, the dielectric constant of the insulator 512 is preferably lower than that of the insulator 511. When a material with a low dielectric constant is used for the interlayer film, the parasitic capacitance generated between wirings can be reduced.

In the transistor 510A, the conductor 560 sometimes functions as a gate electrode.

Like the insulator 511 or the insulator 512, the insulator 514 and the insulator 516 function as interlayer films. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side of the insulator 514. Moreover, for example, the insulator 516 preferably has a lower dielectric constant than the insulator 514. When a material with a low dielectric constant is used for the interlayer film, the parasitic capacitance generated between wirings can be reduced.

The insulator 522 preferably has a barrier property. The insulator 522 having a barrier property functions as a layer that inhibits entry of impurities such as hydrogen into the transistor 510A from the surroundings of the transistor 510A.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current may arise because of a thinner gate insulating film. When a high-k material is used for an insulator functioning as the gate insulating film, a gate potential during operation of the transistor can be reduced while the physical thickness is maintained.

For example, it is preferable that the insulator 521 be thermally stable. For example, silicon oxide and silicon oxynitride, which have thermal stability, are preferable. In addition, a combination of an insulator of a high-k material and silicon oxide or silicon oxynitride allows the insulator 521 to have a stacked-layer structure with thermal stability and a high dielectric constant.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one kind of metal oxide, can be used.

Note that the oxide 530c is preferably provided in the opening in the insulator 580 with the insulator 574 positioned therebetween. When the insulator 574 has a barrier property, diffusion of impurities from the insulator 580 into the oxide 530 can be inhibited.

One of the conductors 542 functions as a source electrode and the other functions as a drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

Although a single-layer structure is shown in FIG. 11, a stacked-layer structure of two or more layers may be employed. For example, a tantalum nitride film and a tungsten film may be stacked. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer may be provided over the conductor 542. The barrier layer is preferably formed using a material having a barrier property against oxygen or hydrogen. This structure can inhibit oxidation of the conductor 542 at the time of deposition of the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening in the insulator 580 with the oxide 530c and the insulator 574 positioned therebetween.

As miniaturization and high integration of transistors progress, a problem such as leakage current may arise because of thinner gate insulating. In that case, the insulator 550 may have a stacked-layer structure. When the insulator functioning as the gate insulating film has a stacked-layer structure of a high-k material and a thermally stable material, a gate potential during operation of the transistor can be reduced while the physical thickness is maintained. Furthermore, the stacked-layer structure can be thermally stable and have a high dielectric constant.

The conductor 560 functioning as a gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material that has a function of inhibiting diffusion of oxygen (e.g., at least one of oxygen atoms, oxygen molecules, and the like). Note that in this specification, a function of inhibiting diffusion of impurities or oxygen means a function of inhibiting diffusion of any one or all of the above impurities and the above oxygen.

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

As a conductive material having a function of inhibiting diffusion of oxygen, for example, tantalum, tantalum nitride, ruthenium, or ruthenium oxide is preferably used. For the conductor 560a, the oxide semiconductor that can be used as the oxide 530 can be used. In that case, when the conductor 560b is deposited by a sputtering method, the conductor 560a can have a reduced electric resistance to be a conductor. This can be referred to as an OC (Oxide Conductor) electrode.

The conductor 560b is preferably formed using a conductive material containing tungsten, copper, or aluminum as its main component. The conductor 560 functions as a wiring and thus is preferably formed using a conductor having high conductivity. For example, a conductive material containing tungsten, copper, or aluminum as its main component can be used. The conductor 560b may have a stacked-layer structure, for example, a stack of any of the above conductive materials and titanium or titanium nitride.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 582, and the insulator 584 function as interlayer films.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower dielectric constant than the insulator 582. When a material with a low dielectric constant is used for the interlayer films, the parasitic capacitance generated between wirings can be reduced.

The transistor 510A may be electrically connected to another component through a plug or a wiring such as the conductor 546 embedded in the insulator 580, the insulator 582, and the insulator 584.

As a material for the conductor 546, a conductive material such as a metal material, an alloy material, a metal nitride material, or a metal oxide material can be used as a single layer or stacked layers. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

When the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

With the above structure, a semiconductor device including a transistor that contains an oxide semiconductor and has a high on-state current can be provided. Alternatively, a semiconductor device including a transistor that contains an oxide semiconductor and has a low off-state current can be provided. Alternatively, a semiconductor device that has small variations in electrical characteristics, stable electrical characteristics, and high reliability can be provided.

<Transistor Structure Example 2>

Figure 12A:
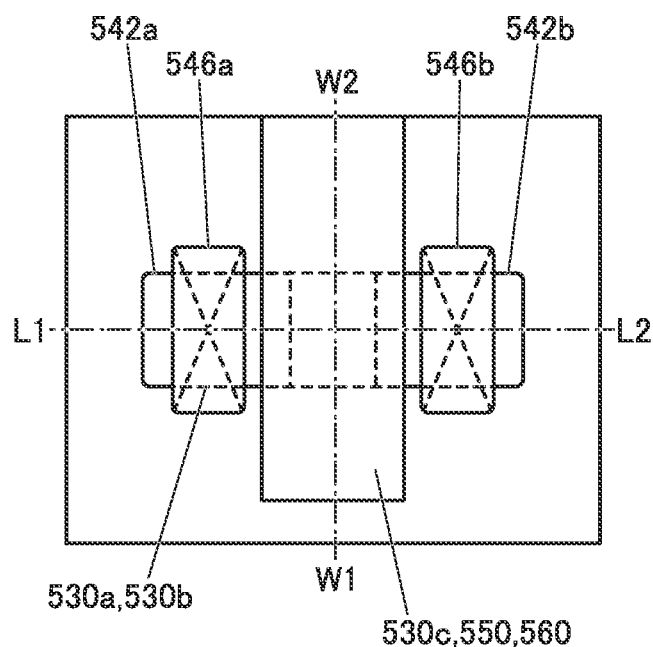
FIG. 12(A) is a top view illustrating a structure example of a transistor.
Figure 12C:
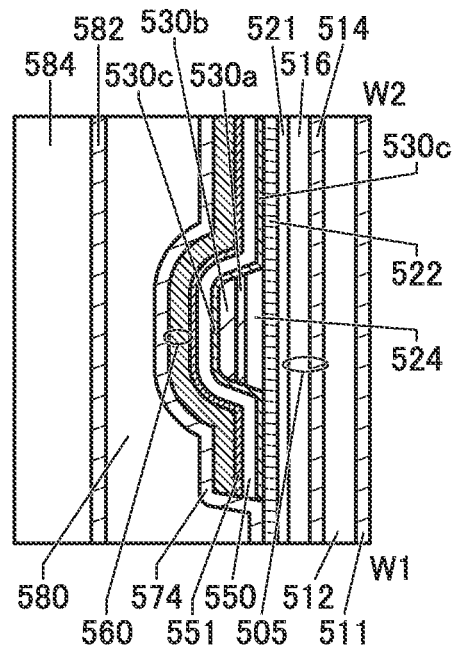
FIGS. 12(B) and 12(C) are cross-sectional views illustrating the structure example of the transistor.
Figure 12B:
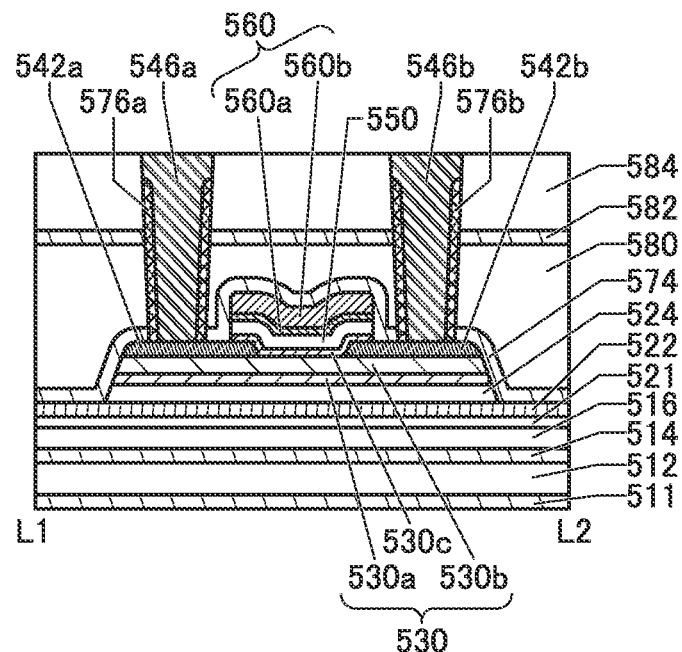

A structure example of a transistor 510B is described with reference to FIGS. 12(A), 12(B), and 12(C). FIG. 12(A) is a top view of the transistor 510B. FIG. 12(B) is a cross-sectional view of a portion indicated by a dashed-dotted line L1-L2 in FIG. 12(A). FIG. 12(C) is a cross-sectional view of a portion indicated by a dashed-dotted line W1-W2 in FIG. 12(A). Note that for clarification of the drawing, some components are not illustrated in the top view of FIG. 12(A).

The transistor 510B is a variation example of the transistor 510A. Therefore, differences from the transistor 510A will be mainly described to avoid repeated description.

The transistor 510B includes a region where the conductor 542 (the conductor 542a and the conductor 542b), the oxide 530c, the insulator 550, and the conductor 560 overlap with each other. With this structure, a transistor having a high on-state current can be provided. Moreover, a transistor having high controllability can be provided.

The conductor 560 functioning as a gate electrode includes the conductor 560a and the conductor 560b over the conductor 560a. The conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 574 is preferably provided to cover the top surface and a side surface of the conductor 560, a side surface of the insulator 550, and the side surface of the oxide 530c. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit oxidation of the conductor 560. Moreover, the insulator 574 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a semiconductor device with low power consumption. Specifically, a material having a low oxidation resistance and high conductivity, such as tungsten or aluminum, can be used. Moreover, for example, a conductor that can be easily deposited or processed can be used.

<Transistor Structure Example 3>

Figure 13A:
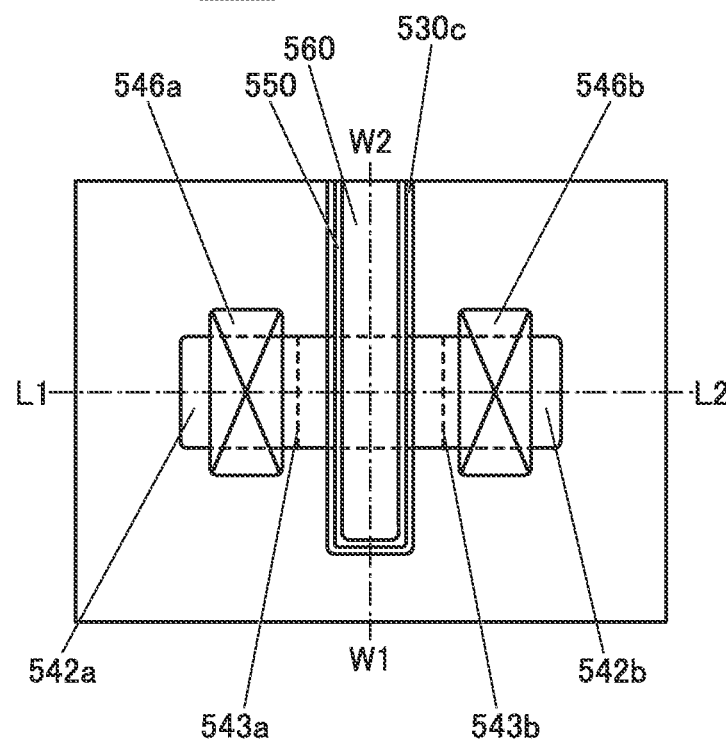
FIG. 13(A) is a top view illustrating a structure example of a transistor.
Figure 13C:
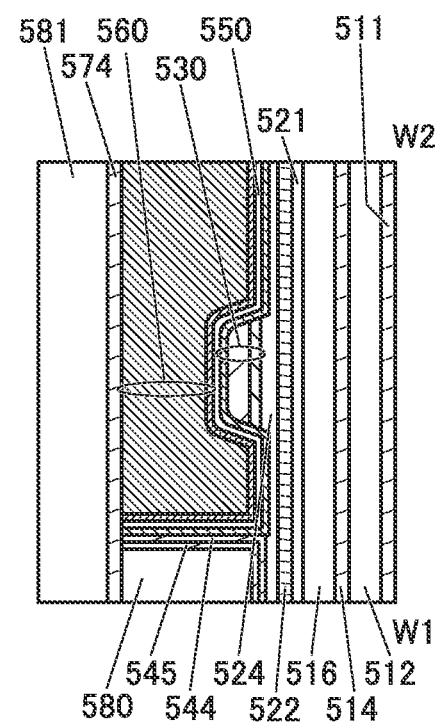
FIGS. 13(B) and 13(C) are cross-sectional views illustrating the structure example of the transistor.
Figure 13B:
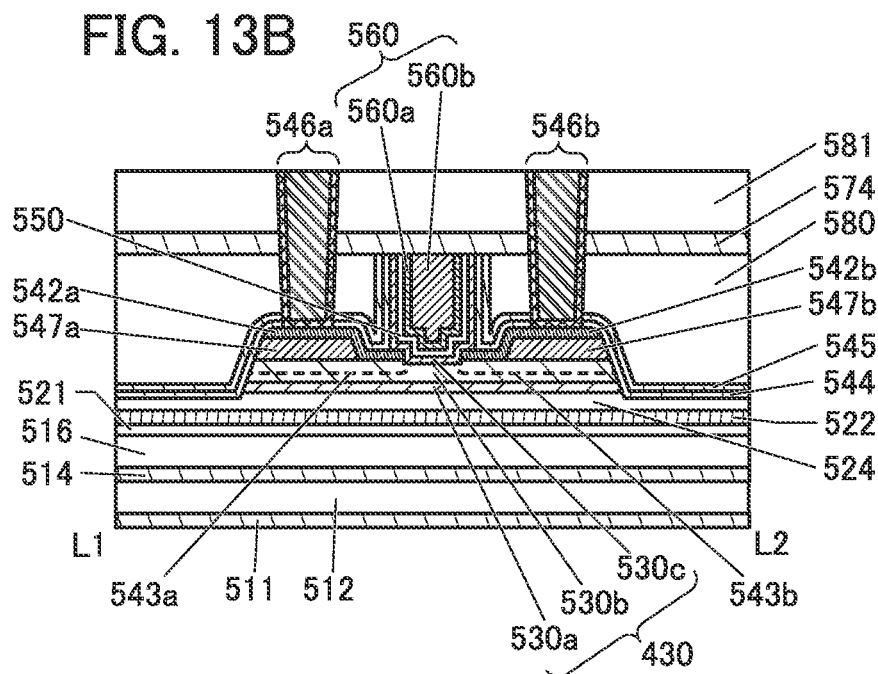

A structure example of a transistor 510C is described with reference to FIGS. 13(A), 13(B), and 13(C). FIG. 13(A) is a top view of the transistor 510C. FIG. 13(B) is a cross-sectional view of a portion indicated by a dashed-dotted line L1-L2 in FIG. 13(A). FIG. 13(C) is a cross-sectional view of a portion indicated by a dashed-dotted line W1-W2 in FIG. 13(A). Note that for clarification of the drawing, some components are not illustrated in the top view of FIG. 13(A).

The transistor 510C is a variation example of the transistor 510A. Therefore, differences from the transistor 510A will be mainly described to avoid repeated description.

In the transistor 510C illustrated in FIG. 13, a conductor 547a is positioned between the conductor 542a and the oxide 530b and a conductor 547b is positioned between the conductor 542b and the oxide 530b. Here, the conductor 542a (the conductor 542b) has a region that extends beyond the top surface and a side surface on the conductor 560 side of the conductor 547a (the conductor 547b) and is in contact with the top surface of the oxide 530b. For the conductors 547, a conductor that can be used for the conductor 542 is used. It is preferred that the thickness of the conductor 547 be at least greater than that of the conductor 542.

In the transistor 510C illustrated in FIG. 13, because of the above structure, the conductor 542 can be closer to the conductor 560 than in the transistor 510A. Alternatively, the conductor 560 and an end portion of the conductor 542a and an end portion of the conductor 542b can overlap with each other. Accordingly, the effective channel length of the transistor 510C can be shortened, and the on-state current and the frequency characteristics can be improved.

The conductor 547a (the conductor 547b) is preferably provided to be overlapped by the conductor 542a (the conductor 542b). With such a structure, the conductor 547a (the conductor 547b) can function as a stopper to prevent over-etching of the oxide 530b in etching for forming the opening in which the conductor 546a (the conductor 546b) is to be embedded.

The transistor 510C illustrated in FIG. 13 may have a structure in which an insulator 545 is positioned on and in contact with the insulator 544. The insulator 544 preferably functions as a barrier insulating film that inhibits entry of impurities such as water or hydrogen and excess oxygen into the transistor 510C from the insulator 580 side. The insulator 544 can be formed using an insulator that can be used for the insulator 545. In addition, the insulator 544 may be formed using a nitride insulator such as aluminum nitride, aluminum titanium nitride, titanium nitride, silicon nitride, or silicon nitride oxide, for example.

<Transistor Structure Example 4>

Figure 14A:
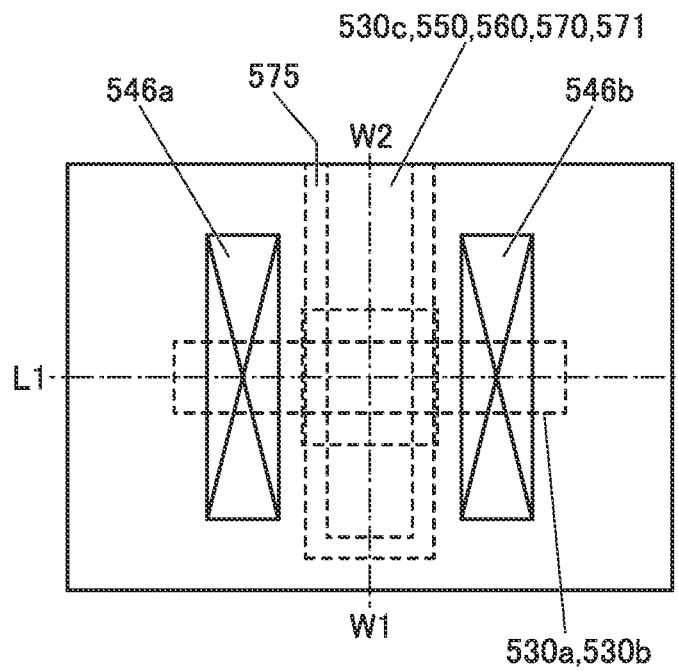
FIG. 14(A) is a top view illustrating a structure example of a transistor.
Figure 14C:
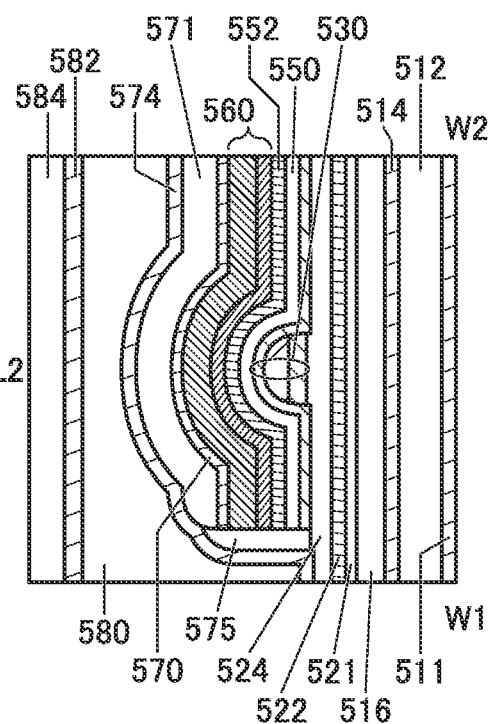
FIGS. 14(B) and 14(C) are cross-sectional views illustrating the structure example of the transistor.
Figure 14B:
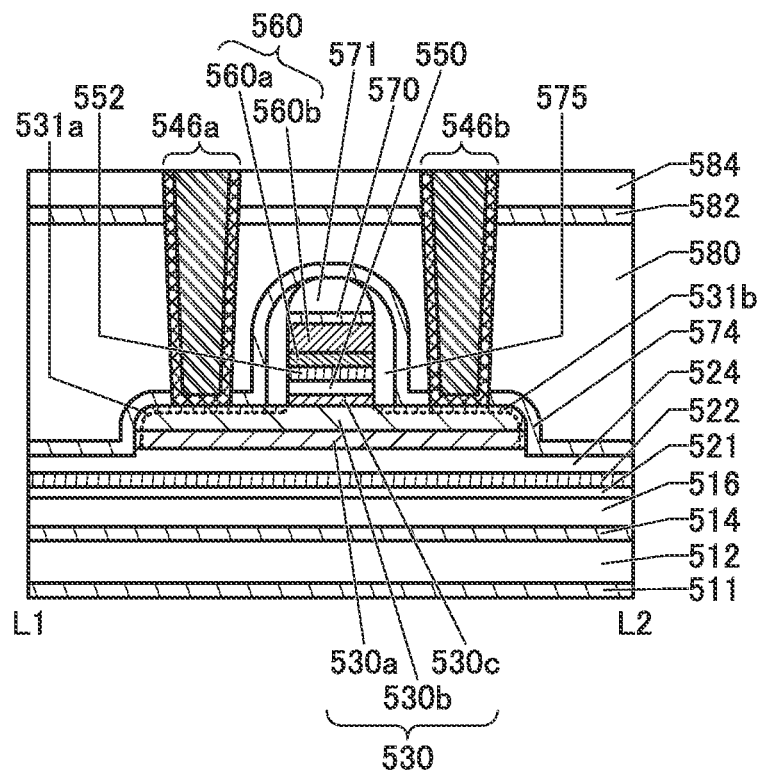

A structure example of a transistor 510D is described with reference to FIGS. 14(A), 14(B), and 14(C). FIG. 14(A) is a top view of the transistor 510D. FIG. 14(B) is a cross-sectional view of a portion indicated by a dashed-dotted line L1-L2 in FIG. 14(A). FIG. 14(C) is a cross-sectional view of a portion indicated by a dashed-dotted line W1-W2 in FIG. 14(A). Note that for clarification of the drawing, some components are not illustrated in the top view of FIG. 14(A).

The transistor 510D is a variation example of the above transistors. Therefore, differences from the above transistors will be mainly described to avoid repeated description.

In FIGS. 14(A) to 14(C), the insulator 550 is provided over the oxide 530c and a metal oxide 552 is provided over the insulator 550. The conductor 560 is provided over the metal oxide 552, and an insulator 570 is provided over the conductor 560. An insulator 571 is provided over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidization of the conductor 560 due to oxygen can be suppressed.

Note that the metal oxide 552 may function as part of a gate. For example, an oxide semiconductor that can be used for the oxide 530 can be used for the metal oxide 552. In this case, when the conductor 560 is deposited by a sputtering method, the metal oxide 552 can have a reduced electric resistance to be a conductive layer. This can be called an OC electrode.

Note that the metal oxide 552 functions as part of a gate insulating film in some cases. Thus, when silicon oxide, silicon oxynitride, or the like is used for the insulator 550, a metal oxide that is a high-k material with a high dielectric constant is preferably used for the metal oxide 552. Such a stacked-layer structure can be thermally stable and can have a high dielectric constant. Thus, a gate potential that is applied during operation of the transistor can be reduced while the physical thickness is maintained. In addition, the equivalent oxide thickness (EOT) of the insulating layer functioning as the gate insulating film can be reduced.

Although the metal oxide 552 in the transistor 510D is shown as a single layer, the metal oxide 552 may have a stacked-layer structure of two or more layers. For example, a metal oxide functioning as part of a gate electrode and a metal oxide functioning as part of the gate insulating film may be stacked.

With the metal oxide 552 functioning as a gate electrode, the on-state current of the transistor 510D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by heat treatment in a later step. Note that the metal oxide 552 is not an essential structure. Design is appropriately set in consideration of required transistor characteristics.

For the insulator 570, an insulating material having a function of inhibiting the passage of oxygen and impurities such as water and hydrogen is preferably used. For example, aluminum oxide or hafnium oxide is preferably used. Thus, oxidization of the conductor 560 due to oxygen from above the insulator 570 can be inhibited. Moreover, entry of impurities such as water and hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a surface of the substrate can be greater than or equal to 75° and less than or equal to 100°, preferably greater than or equal to 80° and less than or equal to 95°.

An insulating material having a function of inhibiting the passage of oxygen and impurities such as water and hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530c are selected and removed using the insulator 571 as a hard mask, whereby their side surfaces can be substantially aligned with each other and a surface of the oxide 530b can be partly exposed.

The transistor 510D includes a region 531a and a region 531b on part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to "impurity regions" or "low-resistance regions".

The region 531a and the region 531b can be formed in a self-aligned manner by using the insulator 571 and/or the conductor 560 as a mask. Accordingly, the conductor 560 does not overlap with the region 531a and/or the region 531b, so that the parasitic capacitance can be reduced. Moreover, an offset region is not formed between a channel formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and a region where the above-described addition of the impurity element is not performed. The offset region can be formed by the above-described addition of the impurity element after the formation of an insulator 575. In this case, the insulator 575 serves as a mask like the insulator 571 or the like. Thus, the impurity element is not added to a region of the oxide 530b overlapped by the insulator 575, so that the electrical resistivity of the region can be kept high.

The transistor 510D includes the insulator 575 on the side surfaces of the insulator 570, the conductor 560, the metal oxide 552, the insulator 550, and the oxide 530c. The insulator 575 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 574 over the insulator 575 and the oxide 530. The insulator 574 is preferably deposited by a sputtering method. When a sputtering method is used, an insulator containing few impurities such as water and hydrogen can be deposited. For example, aluminum oxide is preferably used for the insulator 574.

Note that an oxide film obtained by a sputtering method may extract hydrogen from the structure body over which the oxide film is deposited. Thus, the hydrogen concentration in the oxide 530 and the insulator 575 can be reduced when the insulator 574 absorbs hydrogen and water from the oxide 530 and the insulator 575.

<Transistor Structure Example 5>

Figure 15A:
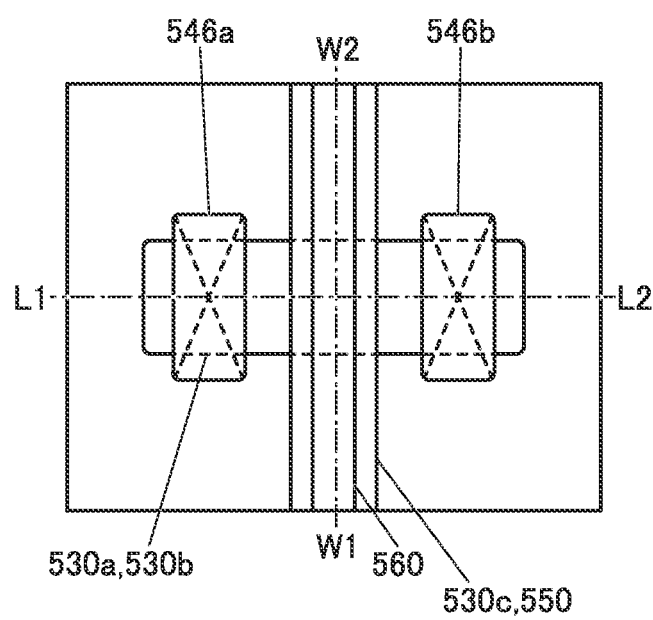
FIG. 15(A) is a top view illustrating a structure example of a transistor.
Figure 15C:
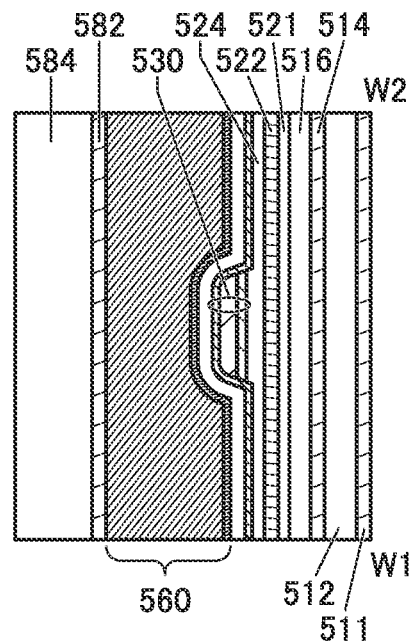
FIGS. 15(B) and 15(C) are cross-sectional views illustrating the structure example of the transistor.
Figure 15B:
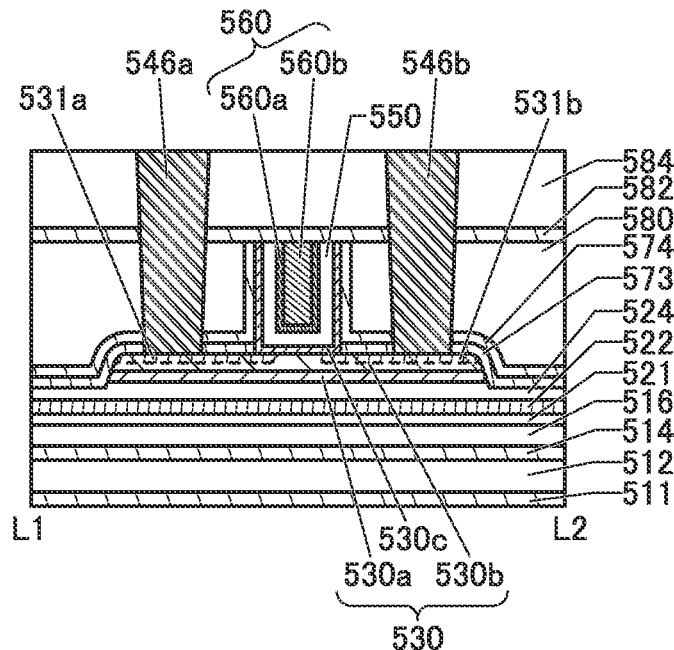

A structure example of a transistor 510E is described with reference to FIG. 15(A) to FIG. 15(C). FIG. 15(A) is a top view of the transistor 510E. FIG. 15(B) is a cross-sectional view of a portion indicated by a dashed-dotted line L1-L2 in FIG. 15(A). FIG. 15(C) is a cross-sectional view of a portion indicated by a dashed-dotted line W1-W2 in FIG. 15(A). Note that for clarification of the drawing, some components are not illustrated in the top view of FIG. 15(A).

The transistor 510E is a variation example of the above transistors. Therefore, differences from the above transistors will be mainly described to avoid repeated description.

In FIGS. 15(A) to 15(C), the conductor 542 is not provided, and part of the exposed surface of the oxide 530b includes the region 531a and the region 531b. One of the region 531a and the region 531b functions as a source region, and the other functions as a drain region. Moreover, an insulator 573 is included between the oxide 530b and the insulator 574.

The regions 531 (the region 531a and the region 531b) illustrated in FIG. 15 are regions where an element described below is added to the oxide 530b. The regions 531 can be formed with the use of a dummy gate, for example.

Specifically, a dummy gate is provided over the oxide 530b, and the above element that reduces the resistance of the oxide 530b is added using the dummy gate as a mask. That is, the element is added to regions of the oxide 530 that are not overlapped by the dummy gate, whereby the regions 531 are formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas, or the like may be used. Typical examples of the rare gas include helium, neon, argon, krypton, and xenon. The concentration of the element is measured by secondary ion mass spectrometry (SIMS) or the like.

In particular, boron and phosphorus are preferable because an apparatus used in a manufacturing line for amorphous silicon or low-temperature polysilicon can be used. Since the existing facility can be used, capital investment can be reduced.

Next, an insulating film to be the insulator 573 and an insulating film to be the insulator 574 may be formed over the oxide 530*b* and the dummy gate. Stacking the insulating film to be the insulator 573 and the insulating film to be the insulator 574 can provide a region where the region 531, the oxide 530*c*, and the insulator 550 overlap with each other.

Specifically, after an insulating film to be the insulator 580 is provided over the insulating film to be the insulator 574, the insulating film to be the insulator 580 is subjected to CMP treatment, whereby part of the insulating film to be the insulator 580 is removed and the dummy gate is exposed. Then, when the dummy gate is removed, part of the insulator 573 in contact with the dummy gate is preferably also removed. Thus, the insulator 574 and the insulator 573 are exposed at a side surface of an opening provided in the insulator 580, and the region 531 provided in the oxide 530*b* is partly exposed at the bottom surface of the opening. Next, an oxide film to be the oxide 530*c*, an insulating film to be the insulator 550, and a conductive film to be the conductor 560 are formed in this order in the opening, and then an oxide film to be the oxide 530*c*, an insulating film to be the insulator 550, and a conductive film to be the conductor 560 are partly removed by CMP treatment or the like until the insulator 580 is exposed; thus, the transistor illustrated in FIG. 15 can be formed.

Note that the insulator 573 and the insulator 574 are not essential components. Design is appropriately set in consideration of required transistor characteristics.

The cost of the transistor illustrated in FIG. 15 can be reduced because an existing apparatus can be used and the conductor 542 is not provided.

<Transistor Structure Example 6>

Although FIG. 9 and FIGS. 10(A) and 10(B) illustrate a structure example in which the conductor 560 that functions as a gate is formed in an opening of the insulator 580, a structure in which the insulator is provided above the conductor can be employed, for example. A structure example of such a transistor is illustrated in FIG. 16 and FIG. 17.

Figure 16A:
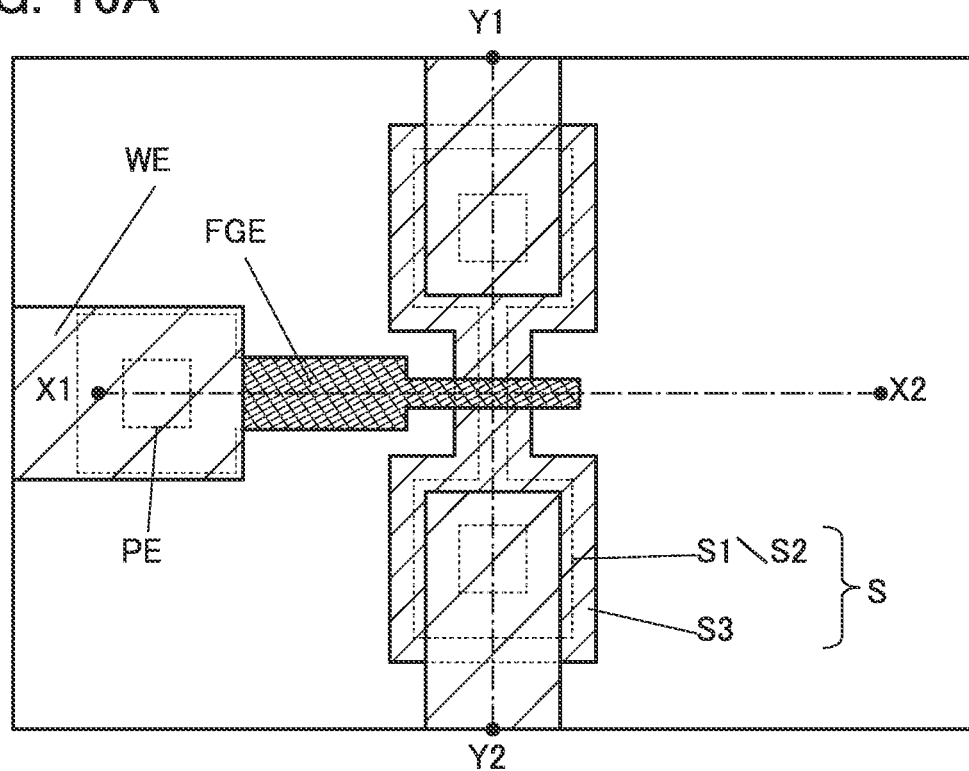
FIG. 16(A) is a top view illustrating a structure example of a transistor.
Figure 16B:
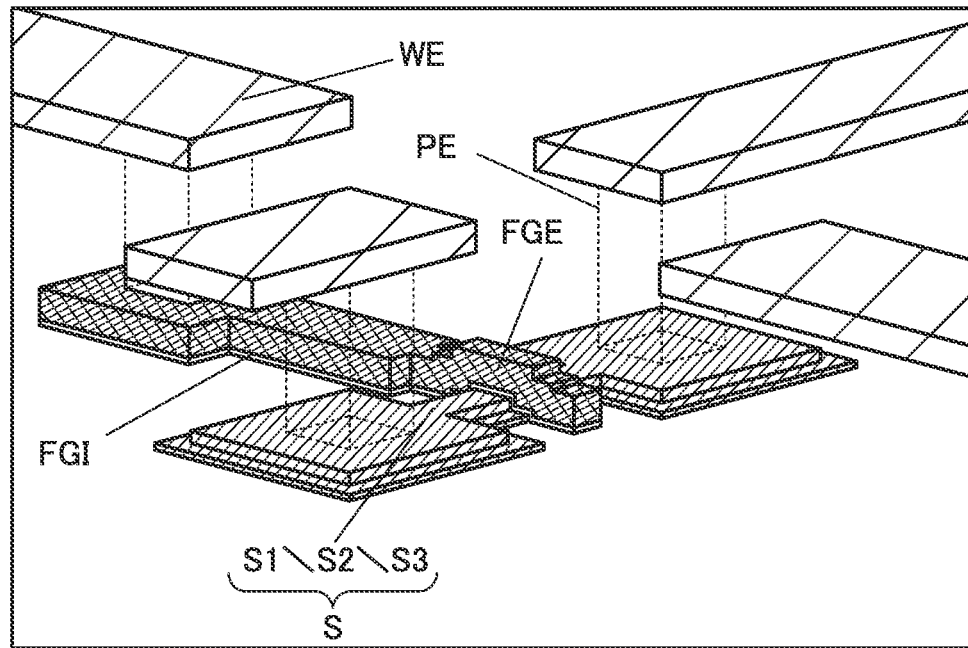
FIG. 16(B) is a perspective view illustrating the structure example of the transistor.
Figure 17A:
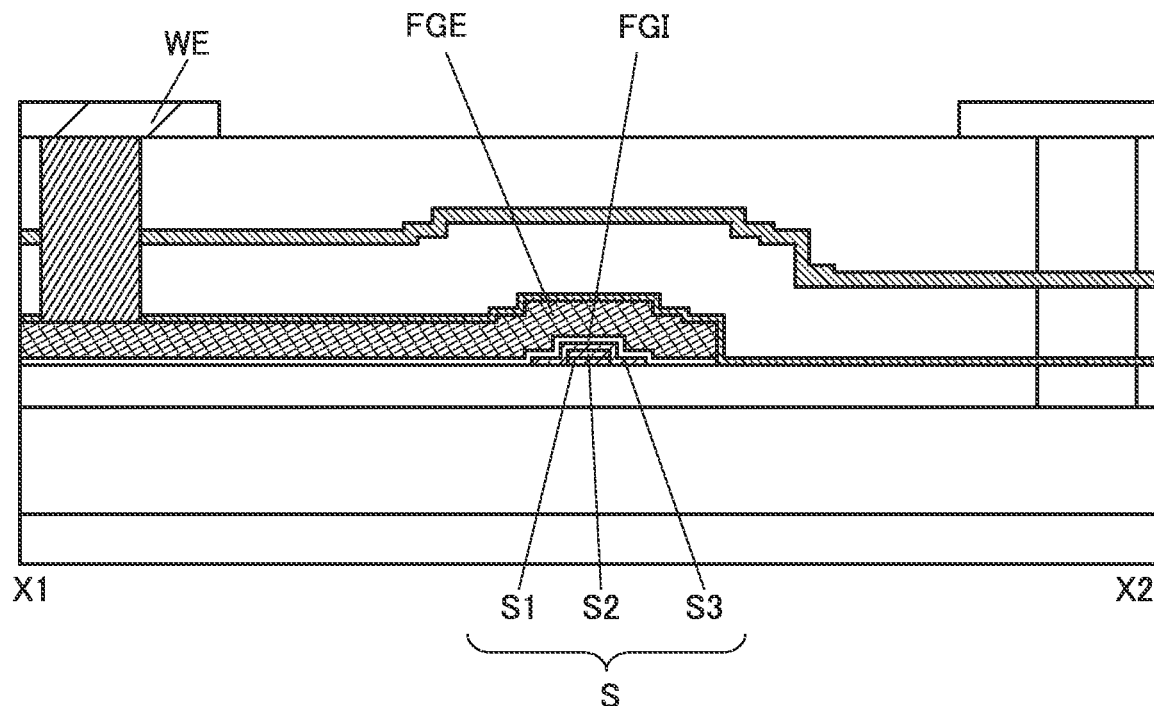
FIGS. 17(A) and 17(B) are cross-sectional views illustrating a structure example of a transistor.
Figure 17B:
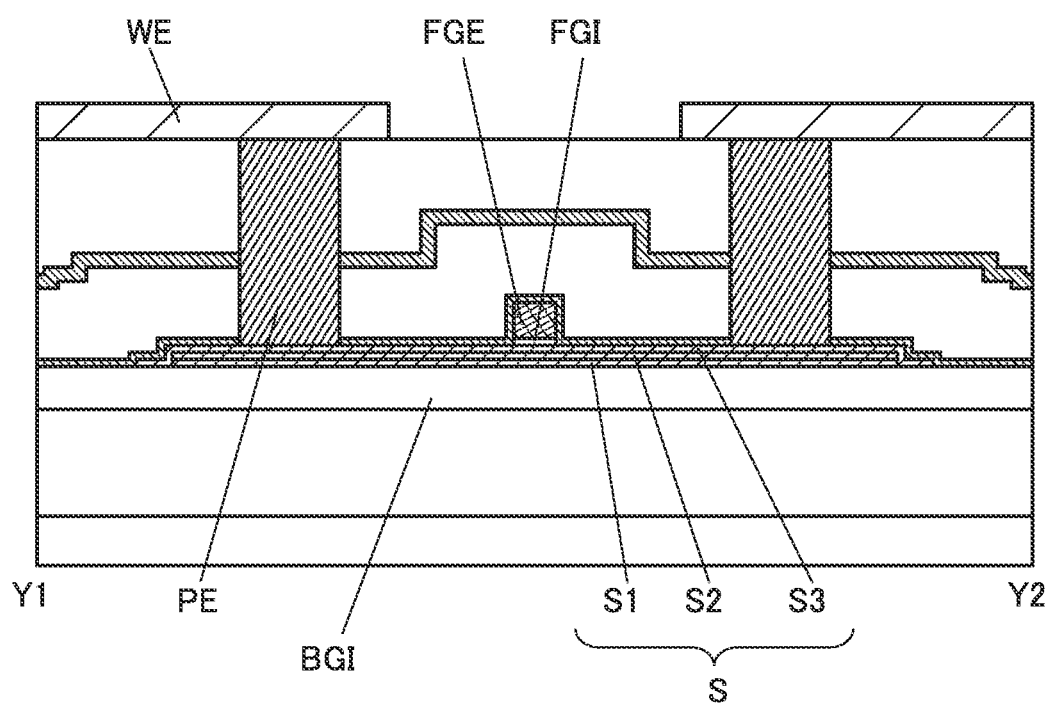

FIG. 16(A) is a top view of a transistor and FIG. 16(B) is a perspective view of the transistor. FIG. 17(A) is a cross-sectional view taken along X1-X2 in FIG. 16(A), and FIG. 17(B) is a cross-sectional view taken along Y1-Y2 in FIG. 16(A).

The transistor illustrated in FIGS. 16(A) and 16(B) and FIGS. 17(A) and 17(B) includes a conductor BGE having a function of a back gate, an insulator BGI having a function of a gate insulating film, an oxide semiconductor S, an insulator FGI having a function of a gate insulating film, a conductor FGE having a function of a front gate, and a conductor WE having a function of a wiring. A conductor PE has a function of a plug for connecting the conductor WE to the oxide S or the conductor FGE. Note that an example in which the oxide semiconductor S includes three layers of oxides S1, S2, and S3 is shown here.

Note that this embodiment can be implemented in combination with the other embodiments described in this specification as appropriate.

Embodiment 4

In this embodiment, the composition of a metal oxide that can be used in the OS transistor described in the above embodiment will be described.

<Composition of Metal Oxide>

Note that in this specification and the like, CAAC (c-axis aligned crystal) and CAC (Cloud-Aligned Composite) might be stated. Note that CAAC refers to an example of a crystal structure, and CAC refers to an example of a function or a material composition.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in a channel formation region of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, the carriers mainly flow in the component having a narrow gap. Moreover, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in an on state can achieve high current driving capability, that is, high on-state current and high field-effect mobility.

In other words, the CAC-OS or the CAC-metal oxide can also be referred to as a matrix composite or a metal matrix composite.

<Structure of Metal Oxide>

Oxide semiconductors are classified into a single-crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

As an oxide semiconductor used for a semiconductor of the transistor, a thin film having high crystallinity is preferably used. With the use of the thin film, the stability or the reliability of the transistor can be improved. Examples of the thin film include a thin film of a single-crystal oxide semiconductor and a thin film of a polycrystalline oxide semiconductor. However, for forming the thin film of a single-crystal oxide semiconductor or the thin film of a polycrystalline oxide semiconductor over a substrate, a high-temperature process or a laser heating process is needed. Thus, the manufacturing cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO with a size of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

The CAAC-OS has c-axis alignment, a plurality of nanocrystals are connected in the a-b plane direction, and the crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited due to the distortion of lattice arrangement. This is probably because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor depending on the analysis method.

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

Note that when the above oxide semiconductor is used for a transistor, the transistor having high field-effect mobility can be achieved. In addition, the transistor having high reliability can be achieved.

Non-Patent Document 6 shows that the transistor using an oxide semiconductor has an extremely low leakage current in a non-conduction state; specifically, the off-state current per micrometer in the channel width of the transistor is of the order of yA/μm ($10^{-24}$ A/μm). For example, a low-power-consumption CPU utilizing a characteristic of a low leakage current of the transistor using an oxide semiconductor is disclosed (see Non-Patent Document 7).

Furthermore, application of a transistor using an oxide semiconductor to a display device that utilizes the characteristic of a low leakage current of the transistor has been reported (see Non-Patent Document 8). In the display device, a displayed image is changed several tens of times per second. The number of times an image is changed per second is called a refresh rate. The refresh rate is also referred to as driving frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

Furthermore, an oxide semiconductor with a low carrier density is preferably used for the transistor. In the case where the carrier density of an oxide semiconductor is reduced, the impurity concentration in the oxide semiconductor is reduced to reduce the density of defect states. In this specification and the like, a state with a low impurity concentration and a low density of defect states is referred to as a highly purified intrinsic or substantially highly purified intrinsic state. For example, an oxide semiconductor has a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

Moreover, a highly purified intrinsic or substantially highly purified intrinsic oxide semiconductor film has a low density of defect states and accordingly may have a low density of trap states.

Charges trapped by the trap states in the oxide semiconductor take a long time to be released and may behave like fixed charges. Thus, a transistor whose channel formation region is formed in an oxide semiconductor having a high density of trap states has unstable electrical characteristics in some cases.

Accordingly, in order to obtain stable electrical characteristics of the transistor, it is effective to reduce the concentration of impurities in the oxide semiconductor. In addition, in order to reduce the concentration of impurities in the oxide semiconductor, the impurity concentration in an adjacent film is also preferably reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon that is a Group 14 element is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by SIMS) are set to lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated, in some cases. Thus, a transistor using an oxide semiconductor that contains an alkali metal or an alkaline earth metal is likely to have normally-on characteristics. Therefore, it is preferable to reduce the concentration of an alkali metal or an alkaline earth metal in the oxide semiconductor. Specifically, the concentration of an alkali metal or an alkaline earth metal in the oxide semiconductor obtained by SIMS is set to lower than or equal to $1\times10^{18}$ atoms/cm$^3$, preferably lower than or equal to $2\times10^{16}$ atoms/cm$^3$.

Furthermore, when containing nitrogen, the oxide semiconductor easily becomes n-type by generation of electrons serving as carriers and an increase in carrier density. As a result, a transistor using an oxide semiconductor containing nitrogen as a semiconductor is likely to have normally-on characteristics. Thus, nitrogen in the oxide semiconductor is preferably reduced as much as possible; for example, the nitrogen concentration in the oxide semiconductor is set to lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ in SIMS.

Furthermore, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurities is used for a channel formation region of a transistor, stable electrical characteristics can be given.

The discovery of the CAAC structure and the nc structure has contributed to an improvement in electrical characteristics and reliability of a transistor using an oxide semiconductor having the CAAC structure or the nc structure, a reduction in manufacturing cost, and an improvement in throughput. Furthermore, applications of the transistor to a display device and an LSI utilizing the characteristics of a low leakage current of the transistor have been studied.

Note that this embodiment can be implemented in combination with the other embodiments described in this specification as appropriate.

Embodiment 5

In this embodiment, a product image and examples of electronic devices in which the memory device described in the above embodiment can be used will be described.

<Product Image>

Figure 18:
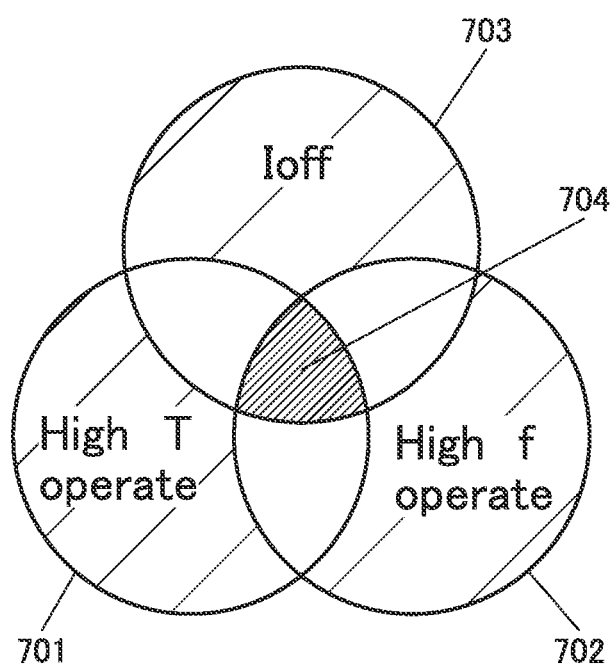
FIG. 18 is a diagram illustrating a product image.

First, FIG. 18 illustrates a product image applicable to the memory device according to one embodiment of the present invention. A region 701 illustrated in FIG. 18 represents high temperature characteristics (High T operate), a region 702 represents high frequency characteristics (High f operate), a region 703 represents low off characteristics (Ioff), and a region 704 represents a region where the region 701, the region 702, and the region 703 overlap one another.

Note that when the region 701 is intended to be satisfied, it can be roughly satisfied by using a carbide or a nitride such as silicon carbide or gallium nitride for a channel formation region of a transistor. When intended to be satisfied, the region 702 can be roughly satisfied by using a silicide such as single crystal silicon or crystalline silicon for a channel formation region of a transistor. In addition, when intended to be satisfied, the region 703 can be roughly satisfied by using an oxide semiconductor or a metal oxide for a channel formation region of a transistor.

The memory device according to one embodiment of the present invention can be favorably used for a product in the range represented by the region 704, for example.

A conventional product has difficulty in satisfying all of the region 701, the region 702, and the region 703. However, a transistor included in the memory device according to one embodiment of the present invention includes a crystalline OS in a channel formation region. In the case where the crystalline OS is included in the channel formation region, a memory device and an electronic device satisfying high temperature characteristics, high frequency characteristics, and low off characteristics can be provided.

Note that examples of a product in the range represented by the region 704 are an electronic device including a low-power consumption and high-performance CPU, an in-car electronic device required to have high reliability in a high-temperature environment, and the like. More specifically, FIGS. 19(A) to 19(E2), FIGS. 20(A) and 20(B), FIGS. 21(A) to 21(C), and FIGS. 22(A) and 22(B) illustrate examples of electronic devices each including the memory device according to one embodiment of the present invention.

<Electronic Device>

The memory device according to one embodiment of the present invention can be used in a variety of electronic devices. In particular, the memory device according to one embodiment of the present invention can be used as a memory incorporated in an electronic device. The description will be made below using an information terminal, a game machine, a household appliance, a moving vehicle, a parallel computer, a system including a server as examples of an electronic device in which the memory device according to one embodiment of the present invention can be used.

Figure 19A:
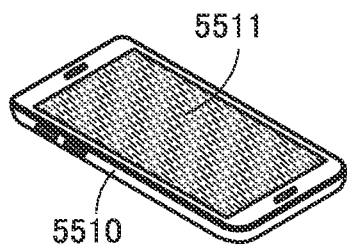

FIG. 19(A) illustrates an information terminal 5500 as an electronic device in which the memory device according to one embodiment of the present invention can be used, for example. The information terminal 5500 is a mobile phone (smartphone). The information terminal 5500 includes a housing 5510 and a display portion 5511, and a touch panel is provided in the display portion 5511 and a button is provided in the housing 5510 as input interfaces.

Figure 19B:
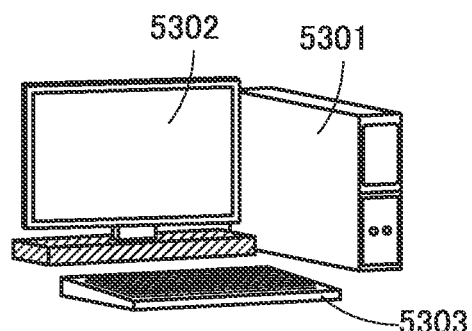

FIG. 19(B) illustrates a desktop information terminal 5300 as an electronic device in which the memory device according to one embodiment of the present invention can be used, for example. The desktop information terminal 5300 includes a main body 5301 of the information terminal, a display 5302, and a keyboard 5303.

Although FIG. 19(A) and FIG. 19(B) illustrate a smartphone and a desktop information terminal as examples, the memory device according to one embodiment of the present invention may be used in a different information terminal such as a PDA (Personal Digital Assistant), a notebook information terminal, or a workstation.

Figure 19C:
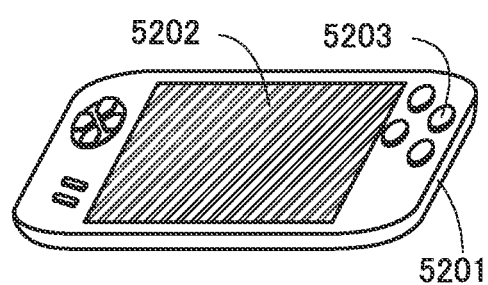

FIG. 19(C) illustrates a portable game machine 5200 as an electronic device in which the memory device according to one embodiment of the present invention can be used, for example. The portable game machine 5200 includes a housing 5201, a display portion 5202, a button 5203, and the like.

Although FIG. 19(C) illustrates a portable game machine as an example, the memory device according to one embodiment of the present invention may be used in a different game machine such as a home stationary game machine, an arcade game machine installed in an entertainment facility (e.g., a game center and an amusement park), or a throwing machine for batting practice installed in sports facilities.

Figure 19D:
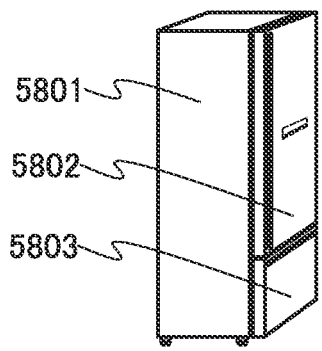
Figure 19D:
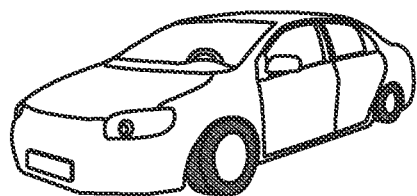
Figure 19D:
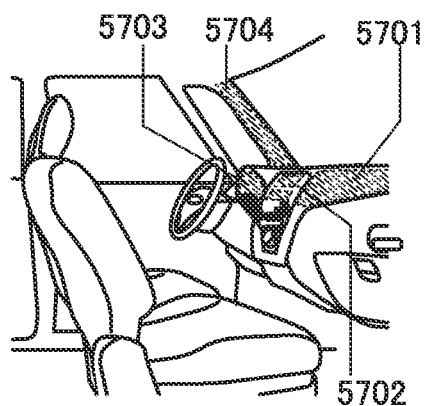

FIG. 19(D) illustrates an electric refrigerator-freezer 5800 as an electronic device in which the memory device according to one embodiment of the present invention can be used, for example. The electric refrigerator-freezer 5800 includes a housing 5801, a refrigerator door 5802, a freezer door 5803, and the like.

Although FIG. 19(D) illustrates an electric refrigerator-freezer as an example, the memory device according to one embodiment of the present invention may be used in a different household appliance such as a vacuum cleaner, a microwave oven, an electric oven, a rice cooker, a water heater, an IH cooker, a water server, a heating-cooling combination appliance such as an air conditioner, a washing machine, a drying machine, and an audio visual appliance, a digital camera, or a digital video camera.

FIG. 19(E1) illustrates an automobile 5700 as an electronic device in which the memory device according to one embodiment of the present invention can be used, for example. FIG. 19(E2) illustrates the periphery of a windshield inside an automobile. FIG. 19(E2) illustrates a display panel 5701, a display panel 5702, and a display panel 5703 that are attached to a dashboard and a display panel 5704 that is attached to a pillar.

The display panel 5701 to the display panel 5703 can provide various kinds of information by displaying a speedometer, a tachometer, a mileage, a fuel meter, a gearshift indicator, an air-conditioning setting, and the like. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided for the automobile 5700. That is, displaying an image taken by the imaging device provided on the outside of the automobile 5700 leads to compensation for the blind spot and enhancement of safety. In addition, showing an image for compensating for the area which a driver cannot see makes it possible for the driver to confirm safety more easily and comfortably. The display panel 5704 can also be used as a lighting device.

Although FIGS. 19(E1) and 19(E2) illustrate the automobile and the display panel attached to the periphery of the windshield of the automobile as examples, the memory device according to one embodiment of the present invention may be used in a different moving vehicle such as a train, a monorail train, a ship, or a flying object (a helicopter, an unmanned aircraft (a drone), an airplane, and a rocket).

Figure 20A:
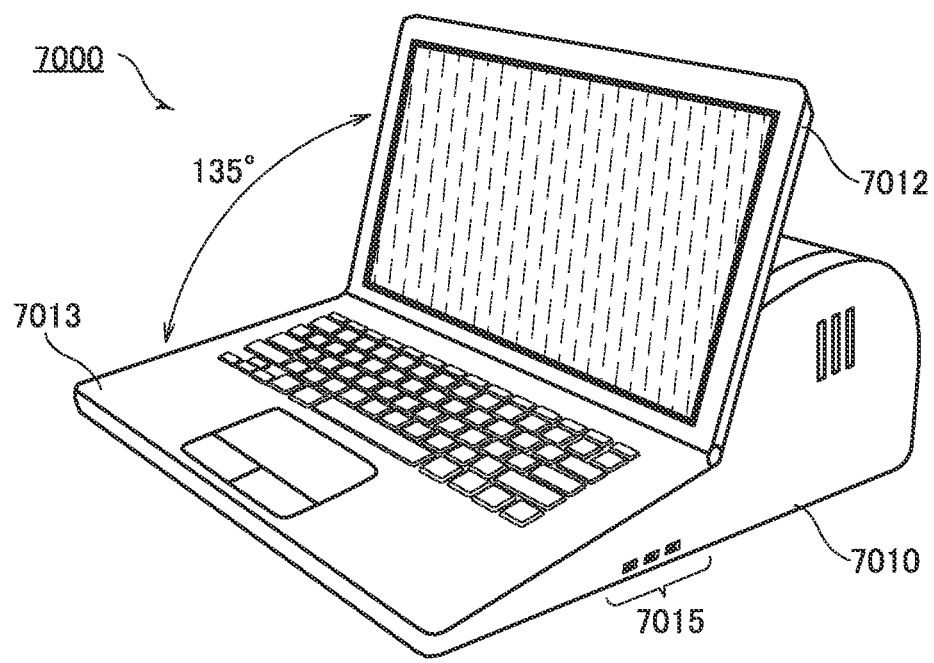
FIGS. 20(A) and 20(B) are diagrams illustrating a structure example of an electronic device.
Figure 20B:
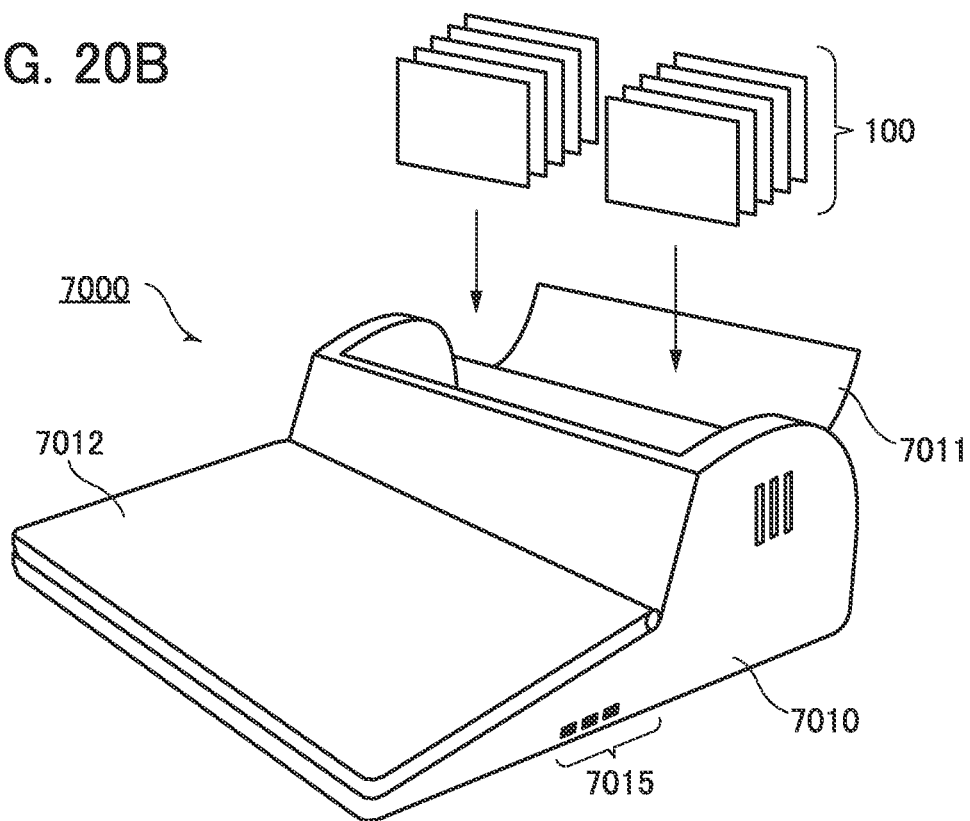

FIG. 20(A) and FIG. 20(B) illustrate an information terminal 7000 as an electronic device in which the memory device according to one embodiment of the present invention can be used. The information terminal 7000 includes a housing 7010, a monitor portion 7012, a keyboard 7013, a port 7015, and the like.

The keyboard 7013 and the port 7015 are provided on the housing 7010. Examples of the port 7015 include a USB port, a LAN port, an HDMI (High-Definition Multimedia Interface; HDMI is a registered trademark) port, and the like.

The monitor portion 7012 attached to the housing 7010 can be opened and closed. FIG. 20(A) illustrates a state in which the monitor portion 7012 is opened and FIG. 20(B) illustrates a state in which the monitor portion 7012 is closed. For example, the maximum angle of the monitor portion 7012 when opened is approximately 135° (see FIG. 20(A)).

The housing 7010 is provided with a cover 7011 that can be opened and closed (see FIG. 20(B)). The memory device 100 according to one embodiment of the present invention is incorporated in the housing 7010, and the memory device 100 can be attached or detached. A device for cooling the memory device 100 or a device for dissipating heat may be provided in the housing 7010. When the cover 7011 is opened, the memory device 100 can be attached or detached, and thus the information terminal 7000 has high extensibility. When a plurality of the memory devices 100 is incorporated into the information terminal 7000, advanced graphics processing, scientific computation, arithmetic operation of artificial intelligence, and the like can be performed.

Figure 21A:
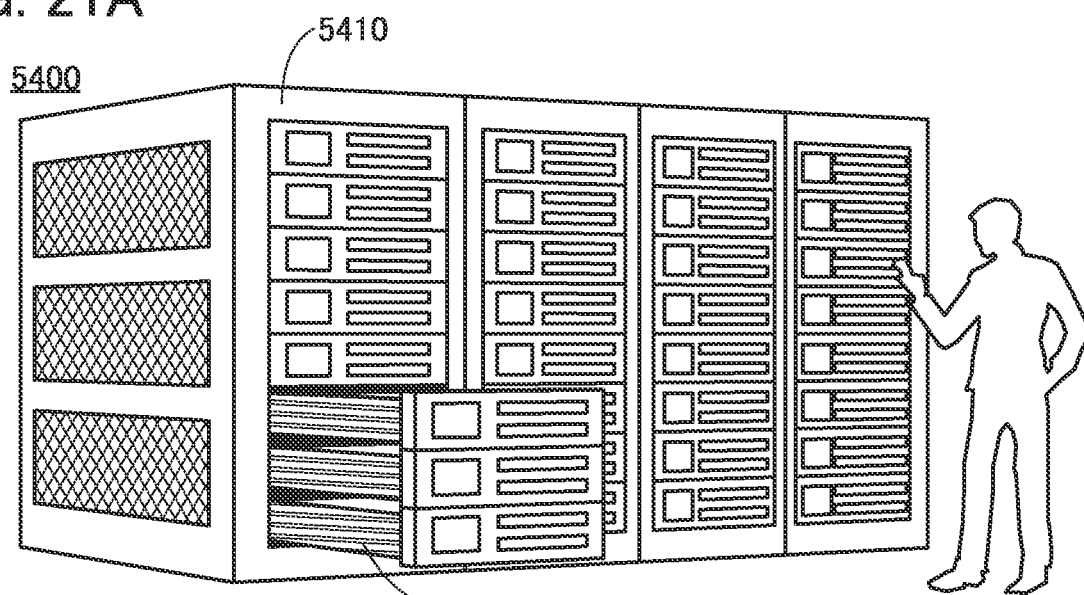
FIGS. 21(A), 21(B), and 21(C) are diagrams illustrating a structure example of an electronic device.

FIG. 21(A) illustrates a large-sized parallel computer 5400 as an electronic device in which the memory device according to one embodiment of the present invention can be used, for example. In the parallel computer 5400, a plurality of rack mount computers 5420 are included in a rack 5410.

Figure 21B:
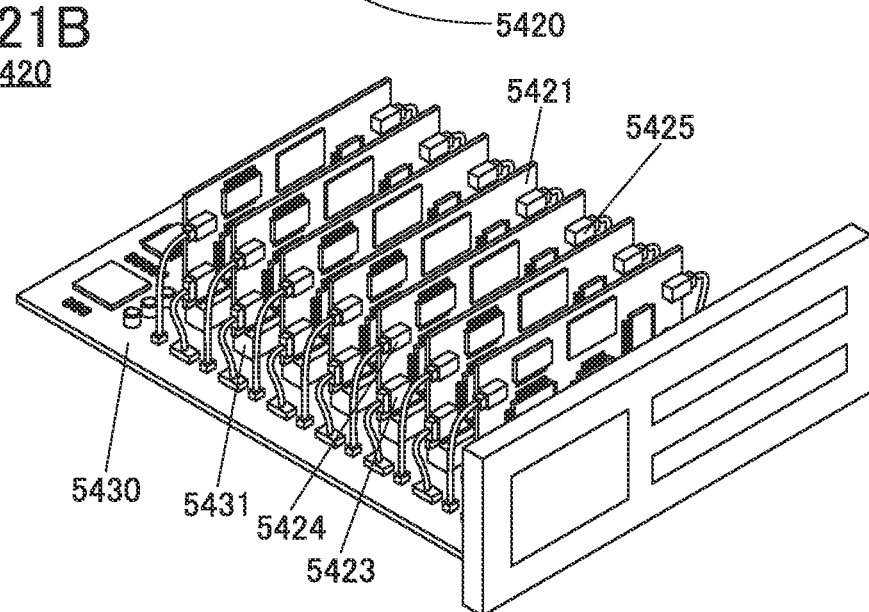

FIG. 21(B) is a schematic perspective view illustrating a structure example of the computer 5420. The computer 5420 includes a motherboard 5430, and the motherboard 5430 includes a plurality of slots 5431. A PC card 5421 is inserted in the slot 5431. The PC card 5421 includes a connection terminal 5423, a connection terminal 5424, and a connection terminal 5425, each of which is connected to the motherboard 5430.

Figure 21C:
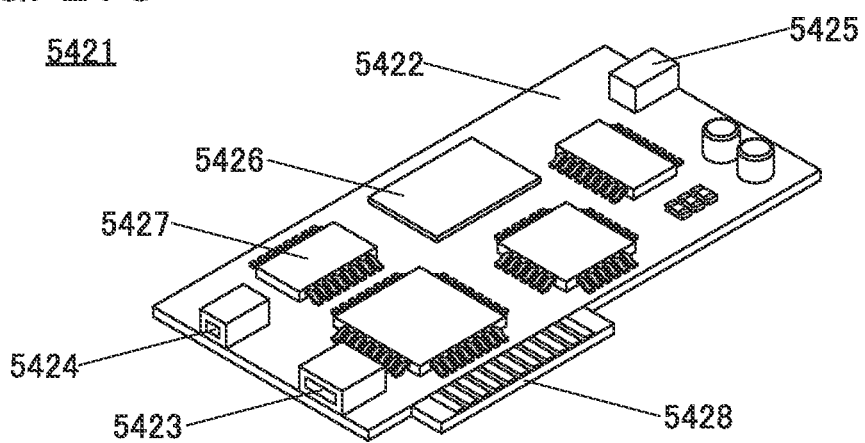

FIG. 21(C) is a schematic perspective view illustrating a structure example of the PC card 5421. The PC card 5421 includes a board 5422, and includes, over the board 5422, the connection terminal 5423, the connection terminal 5424, the connection terminal 5425, a chip 5426, a chip 5427, and the like.

The memory device according to one embodiment of the present invention, a CPU, a GPU (Graphics Processing Unit), a FPGA (Field Programmable Gate Array), or the like is mounted as the chip 5426, the chip 5427, or the like. The chip 5426, the chip 5427, and the like include a plurality of terminals (not illustrated) for inputting and outputting signals. The terminal is inserted in a socket (not illustrated) included in the PC card 5421, whereby electrical connection to the PC card 5421 may be established, or the terminals are reflow-soldered, for example, to wirings included in the PC card 5421, whereby electrical connection may be established.

The connection terminal 5423, the connection terminal 5424, and the connection terminal 5425 can serve, for example, as an interface for performing power supply, signal input/output, or the like to the PC card 5421. Examples of the standard for each of the connection terminal 5423, the connection terminal 5424, and the connection terminal 5425 include USB (Universal Serial Bus), SATA (Serial ATA), SCSI (Small Computer System Interface), and HDMI (registered trademark) in the case of outputting an image signal.

In addition, the PC card 5421 includes a connection terminal 5428 over the board 5422. The connection terminal 5428 has a shape with which the connection terminal 5428 can be inserted in the slot 5431 of the motherboard 5430, and the connection terminal 5428 functions as an interface for connecting the PC card 5421 and the motherboard 5430. An example of the standard for the connection terminal 5428 is PCI Express (also referred to as PCIe; PCI Express and PCIe are registered trademarks).

The parallel computer 5400 can perform large-scale scientific computation and large-scale arithmetic operation required for leaning and inference of artificial intelligence.

Figure 22A:
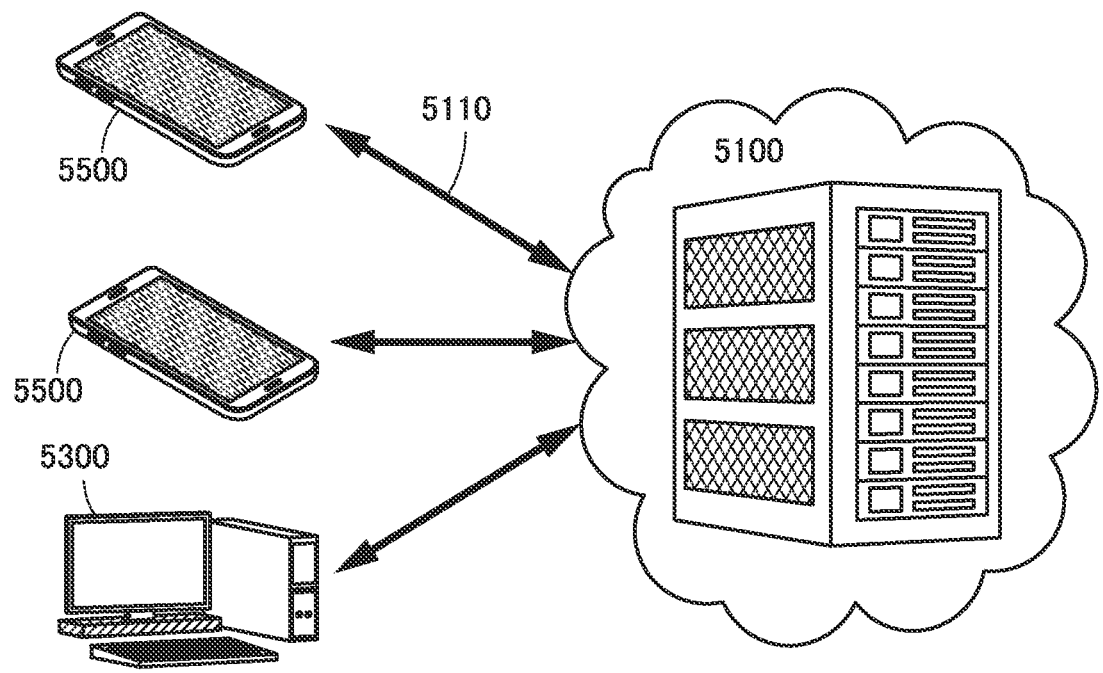
FIGS. 22(A) and 22(B) are diagrams illustrating structure examples of electronic devices.

FIG. 22(A) illustrates a system including a server 5100 as an electronic device in which the memory device according to one embodiment of the present invention can be used, for example. FIG. 22(A) schematically illustrates a state where communication 5110 is performed between the server 5100 and each of the information terminal 5500 and a desktop information terminal 5300.

A user can access the server 5100 from the information terminal 5500, the desktop information terminal 5300, and the like. Then, through the communication 5110 via the Internet, the user can receive a service that the administrator of the server 5100 offers. Examples of the service include e-mailing; SNS (Social Networking Service); online software; cloud storage; a navigation system; a translation system; an Internet game; online shopping; financial trading in stocks, exchange, debts, and the like; reservation system for public facilities, commercial facilities, accommodation facilities, hospitals, and the like; and viewing of videos such as Internet shows, talks, and lectures.

In the case where the processing capacity in scientific computation, arithmetic operation required for leaning and inference of artificial intelligence, or the like is insufficient with the information terminal 5500 or the desktop information terminal 5300 in the user's possession, the user can access the server 5100 through the communication 5110 and perform the computation or the arithmetic operation on the server 5100.

Artificial intelligence can be used in a service provided on the server 5100, for example. For example, adopting artificial intelligence in a navigation system may enable the system to provide flexible guidance to a destination in consideration of a traffic congestion situation, a train running status, or the like. As another example, adopting artificial intelligence in a translation system may enable the system to translate unique expressions such as dialects and slangs appropriately. As another example, using artificial intelligence in a reservation system for hospitals and the like may enable the system to introduce an appropriate hospital, clinic, or the like by judging from a user's symptom, degree of an injury, or the like.

Although FIG. 22(A) illustrates the state in which the communication 5110 is performed between the server 5100 and each of the information terminal 5500 and the desktop information terminal 5300, the communication 5110 may be performed between the server 5100 and an electronic device other than the information terminal. For example, an embodiment may be IoT (Internet of Things), in which electronic devices are connected to the Internet.

Figure 22B:
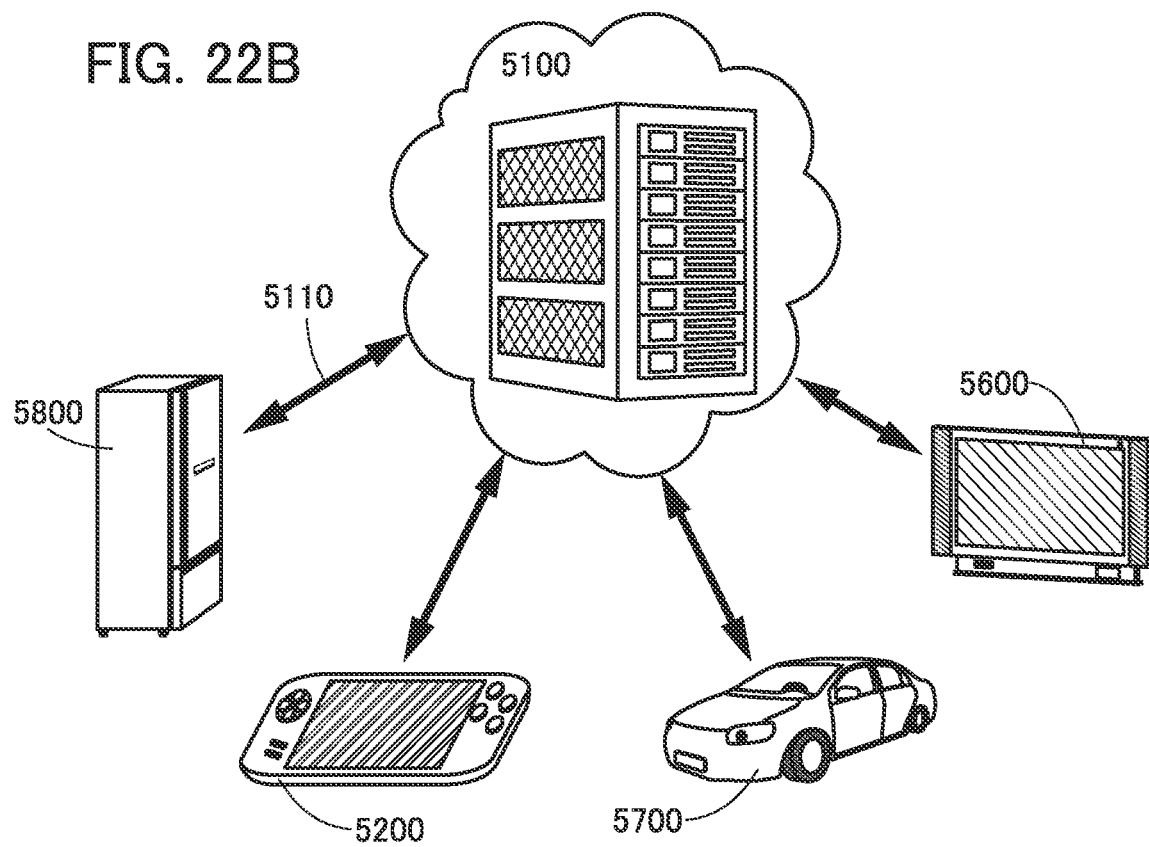

FIG. 22(B) schematically illustrates an example of a state in which the communication 5110 is performed between the server 5100 and each of electronic devices (the electric refrigerator-freezer 5800, the portable game machine 5200, the automobile 5700, and a television device 5600).

Each of the electronic devices in FIG. 22(B) may use artificial intelligence. Arithmetic operation required for leaning and inference of artificial intelligence, and the like can be performed on the server 5100. For example, data necessary for arithmetic operation is transmitted from one of the electronic devices to the server 5100 through the communication 5110, arithmetic operation of artificial intelligence is performed on the server 5100, and output data is transmitted from the server 5100 to the one of the electronic devices through the communication 5110. Thus, the electronic device can use data output by the arithmetic operation of artificial intelligence.

Note that the electronic devices illustrated in FIG. 22(B) are just examples, and the communication 5110 may be performed between the server 5100 and an electronic device not illustrated in FIG. 22(B).

As described above, the memory device according to one embodiment of the present invention can be used in a variety of electronic devices. The memory device according to one embodiment of the present invention can be operated with a small number of power sources, and thus the cost of an electronic device using the memory device can be reduced. In addition, the memory device according to one embodiment of the present invention can have a small chip area, and thus an electronic device can be reduced in size. Alternatively, more memory devices can be mounted on an electronic devices. Moreover, in the memory device according to one embodiment of the present invention, data is not likely to be lost even in a high-temperature environment, and thus high-speed operation is possible. The use of the memory device according to one embodiment of the present invention can provide a highly reliable electronic device that can surely operate even in a high-temperature environment.

Note that this embodiment can be implemented in combination with the other embodiments described in this specification as appropriate.

REFERENCE NUMERALS

C11: capacitor, C12: capacitor, C13: capacitor, C14: capacitor, M11: transistor, M12: transistor, M13: transistor, M14: transistor, M21: transistor, M22: transistor, M23: transistor, M24: transistor, M26: transistor, N11: node, N12: node, N13: node, N14: node, S1: oxide, 31: sense amplifier circuit, 32: AND circuit, 33: analog switch, 34: analog switch, 100: memory device, 101: layer, 105: memory device, 110: peripheral circuit, 115: peripheral circuit, 121: row decoder, 122: word line driver circuit, 123: predecoder, 131: column decoder, 132: bit line driver circuit, 133: precharge circuit, 134: sense amplifier circuit, 135: output MUX circuit, 136: driver circuit, 137: circuit, 138: page buffer, 140: output circuit, 150: potential generation circuit, 151: regulator, 152: regulator, 153: power switch, 160: control logic circuit, 161: SPI controller, 162: serial-parallel convertor, 163: instruction decoder circuit, 164: page address generation circuit, 165: command generation circuit, 166: byte address generation circuit, 167: parallel-serial converter, 168: status register, 201: layer, 210: memory cell array, 211: memory cell, 212: memory cell, 213: memory cell, 214: memory cell, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 510: insulator, 510A: transistor, 510B: transistor, 510C: transistor, 510D: transistor, 510E: transistor, 511: insulator, 512: insulator, 514: insulator, 516: insulator, 518: conductor, 520: insulator, 521: insulator, 522: insulator, 524: insulator, 530: oxide, 530a: oxide, 530b: oxide, 530c: oxide, 531: region, 531a: region, 531b: region, 540a: conductor, 540b: conductor, 542: conductor, 542a: conductor, 542b: conductor, 543: region, 543a: region, 543b: region, 544: insulator, 545: insulator, 546: conductor, 546a: conductor, 546b: conductor, 547: conductor, 547a: conductor, 547b: conductor, 548: conductor, 550: insulator, 552: metal oxide, 560: conductor, 560a: conductor, 560b: conductor, 570: insulator, 571: insulator, 573: insulator, 574: insulator, 575: insulator, 576: insulator, 576a: insulator, 576b: insulator, 580: insulator, 581: insulator, 582: insulator, 584: insulator, 586: insulator, 600: capacitor, 610: conductor, 612: conductor, 620: conductor, 630: insulator, 650: insulator, 701: region, 702: region, 703: region, 704: region, 5100: server, 5110: communication, 5200: portable game machine, 5201: housing, 5202: display portion, 5203: button, 5300: desktop information terminal, 5301: main body, 5302: display, 5303: keyboard, 5400: parallel computer, 5410: rack, 5420: computer, 5421: PC card, 5422: board, 5423: connection terminal, 5424: connection terminal, 5425: connection terminal, 5426: chip, 5427: chip, 5428: connection terminal, 5430: motherboard, 5431: slot, 5500: information terminal, 5510: housing, 5511: display portion, 5600: television device, 5700: automobile, 5701: display panel, 5702: display panel, 5703: display panel, 5704: display panel, 5800: electric refrigerator-freezer, 5801: housing, 5802: refrigerator door, 5803: freezer door, 7000: information terminal, 7010: housing, 7011: cover, 7012: monitor portion, 7013: keyboard, 7015: port

The invention claimed is:

1. A semiconductor device comprising:
   first to fifth wirings; and
   first and second transistors,
   wherein the second transistor comprises a front gate and a back gate,
   wherein one of a source and a drain of the first transistor is electrically connected to the first wiring,
   wherein the other of the source and the drain of the first transistor is electrically connected to a front gate of the second transistor,
   wherein a gate of the first transistor is electrically connected to the third wiring,
   wherein one of a source and a drain of the second transistor is electrically connected to the second wiring,
   wherein the other of the source and the drain of the second transistor is electrically connected to the fourth wiring,
   wherein the back gate of the second transistor is electrically connected to the fifth wiring,
   wherein the first wiring and the second wiring are arranged in parallel to each other,
   wherein the third wiring, the fourth wiring, and the fifth wiring are arranged in parallel to each other,
   wherein the first wiring is arranged to intersect with the fourth wiring,
   wherein each of the first and second transistors is an n-channel transistor, and
   wherein each of the first and second transistors comprises a metal oxide in a channel formation region.

2. A memory device comprising:
   m×n (each of m and n is an integer greater than or equal to 1) memory cells;
   n first wirings;
   n second wirings;
   m third wirings;
   m fourth wirings; and
   m fifth wirings,
   wherein the m×n memory cells are arranged in a matrix,
   wherein each of the memory cells is electrically connected to the first to fifth wirings,
   wherein each of the memory cells comprises first and second transistors,
   wherein the second transistor comprises a front gate and a back gate,
   wherein one of a source and a drain of the first transistor is electrically connected to the first wiring,
   wherein the other of the source and the drain of the first transistor is electrically connected to the front gate of the second transistor, wherein a gate of the first transistor is electrically connected to the third wiring,
wherein one of a source and a drain of the second transistor is electrically connected to the second wiring,
wherein the other of the source and the drain of the second transistor is electrically connected to the fourth wiring,
wherein the back gate of the second transistor is electrically connected to the fifth wiring,
wherein the first wiring and the second wiring are arranged in parallel to each other,
wherein the third wiring, the fourth wiring, and the fifth wiring are arranged in parallel to each other,
wherein the first wiring is arranged to intersect with the fourth wiring,
wherein each of the first and second transistors is an n-channel transistor, and
wherein each of the first and second transistors comprises a metal oxide in a channel formation region.

3. A memory device comprising:
a memory cell array; and
a peripheral circuit,
wherein the memory cell array comprises m×n (each of m and n is an integer greater than or equal to 1) memory cells, n first wirings, n second wirings, m third wirings, and m fourth wirings,
wherein the m×n memory cells are arranged in a matrix,
wherein each of the memory cells is electrically connected to the first to fourth wirings,
wherein each of the memory cells comprises first and second transistors,
wherein one of a source and a drain of the first transistor is electrically connected to the first wiring,
wherein the other of the source and the drain of the first transistor is electrically connected to a gate of the second transistor,
wherein a gate of the first transistor is electrically connected to the third wiring,
wherein one of a source and a drain of the second transistor is electrically connected to the second wiring,
wherein the other of the source and the drain of the second transistor is electrically connected to the fourth wiring,
wherein each of the first transistor and the second transistor is an n-channel transistor,
wherein each of the first transistor and the second transistor comprises a metal oxide in a channel formation region,
wherein the peripheral circuit comprises a first circuit, a second circuit, and a controller,
wherein the first circuit is electrically connected to the first wiring and the second wiring,
wherein the first circuit is configured to write data to the memory cell and is configured to read data from the memory cell,
wherein the second circuit is electrically connected to the third wiring and the fourth wiring,
wherein the second circuit is configured to drive the third wiring and the fourth wiring, and
wherein the controller is configured to control the first circuit and the second circuit.

4. The memory device according to claim 3,
wherein each of the memory cells comprises a capacitor,
wherein one electrode of the capacitor is electrically connected to the gate of the second transistor, and
wherein the other electrode of the capacitor is electrically connected to a wiring supplied with a predetermined potential.

5. The memory device according to claim 3,
wherein the first circuit supplies a first potential or a second potential to the first wiring and the second wiring,
wherein the second circuit supplies the first potential or the second potential to the fourth wiring, and
wherein the second circuit supplies the first potential or a third potential to the third wiring.

6. The memory device according to claim 3,
wherein each of the first circuit and the second circuit comprises a transistor formed on a semiconductor substrate, and
wherein the first transistor and the second transistor are stacked above the semiconductor substrate.

7. A memory device comprising:
a memory cell array; and
a peripheral circuit,
wherein the memory cell array comprises m×n (each of m and n is an integer greater than or equal to 1) memory cells, n first wirings, n second wirings, m third wirings, and m fourth wirings,
wherein the m×n memory cells are arranged in a matrix,
wherein each of the memory cells is electrically connected to the first to fourth wirings,
wherein each of the memory cells comprises first and second transistors,
wherein one of a source and a drain of the first transistor is electrically connected to the first wiring,
wherein the other of the source and the drain of the first transistor is electrically connected to a gate of the second transistor,
wherein a gate of the first transistor is electrically connected to the third wiring,
wherein one of a source and a drain of the second transistor is electrically connected to the second wiring,
wherein the other of the source and the drain of the second transistor is electrically connected to the fourth wiring,
wherein each of the first transistor and the second transistor is an n-channel transistor,
wherein each of the first transistor and the second transistor comprises a metal oxide in a channel formation region,
wherein the peripheral circuit comprises a first circuit, a second circuit, and a controller,
wherein the first circuit is electrically connected to the first wiring and the second wiring,
wherein the first circuit is configured to write data to the memory cell and is configured to read data from the memory cell,
wherein the second circuit is electrically connected to the third wiring and the fourth wiring,
wherein the second circuit is configured to drive the third wiring and the fourth wiring,
wherein the controller is configured to control the first circuit and the second circuit, and
wherein the controller is configured to be a serial peripheral interface.

8. A memory device comprising:
a memory cell array; and
a peripheral circuit,
wherein the memory cell array comprises m×n (each of m and n is an integer greater than or equal to 1) memory cells, n first wirings, n second wirings, m third wirings, and m fourth wirings,
wherein the m×n memory cells are arranged in a matrix,
wherein each of the memory cells is electrically connected to the first to fourth wirings, wherein each of the memory cells comprises first and second transistors, wherein one of a source and a drain of the first transistor is electrically connected to the first wiring, wherein the other of the source and the drain of the first transistor is electrically connected to a gate of the second transistor, wherein a gate of the first transistor is electrically connected to the third wiring, wherein one of a source and a drain of the second transistor is electrically connected to the second wiring, wherein the other of the source and the drain of the second transistor is electrically connected to the fourth wiring, wherein each of the first transistor and the second transistor is an n-channel transistor, wherein each of the first transistor and the second transistor comprises a metal oxide in a channel formation region, wherein the peripheral circuit comprises a first circuit, a second circuit, a controller, and a page buffer, wherein the first circuit is electrically connected to the first wiring and the second wiring, wherein the page buffer is configured to store data temporarily, wherein the controller is configured to write data to the page buffer and is configured to read data from the page buffer, wherein the first circuit is configured to write data read from the page buffer, to the memory cell and is configured to write data read from the memory cell, to the page buffer, wherein the second circuit is electrically connected to the third wiring and the fourth wiring, wherein the second circuit is configured to drive the third wiring and the fourth wiring, wherein the controller is configured to control the first circuit and the second circuit, and wherein the controller is configured to be a serial peripheral interface.

* * * * *